United States Patent
Choucair

(10) Patent No.: US 12,202,730 B2
(45) Date of Patent: Jan. 21, 2025

(54) GRAPHENE COMPLEXES AND COMPOSITIONS THEREOF

(71) Applicant: ARCHER MATERIALS LIMITED, Adelaide (AU)

(72) Inventor: Mohammad Choucair, Arncliffe (AU)

(73) Assignee: ARCHER MATERIALS LIMITED, Adelaide (AU)

( * ) Notice: Subject to any disclaimer, the term of this patent is extended or adjusted under 35 U.S.C. 154(b) by 638 days.

(21) Appl. No.: 17/429,442

(22) PCT Filed: Feb. 14, 2020

(86) PCT No.: PCT/AU2020/050128
§ 371 (c)(1),
(2) Date: Aug. 9, 2021

(87) PCT Pub. No.: WO2020/163921
PCT Pub. Date: Aug. 20, 2020

(65) Prior Publication Data
US 2022/0081302 A1     Mar. 17, 2022

(30) Foreign Application Priority Data
Feb. 15, 2019   (AU) .............................. 2019900486

(51) Int. Cl.
*C01B 32/194*     (2017.01)
*C07F 5/02*     (2006.01)
*C07F 17/00*     (2006.01)
*C09D 11/36*     (2014.01)

(52) U.S. Cl.
CPC ............ *C01B 32/194* (2017.08); *C07F 5/027* (2013.01); *C07F 17/00* (2013.01); *C09D 11/36* (2013.01); *C01P 2006/32* (2013.01); *C01P 2006/40* (2013.01)

(58) Field of Classification Search
CPC ......... C01B 32/194; C07F 5/027; C07F 17/00
See application file for complete search history.

(56) References Cited

PUBLICATIONS

H. Nakamura, et al., 48, Chem. Pharm. Bull. 1034-1038 (2000) (Year: 2000).*
Y. Zhu, et al., 127, Journal of the American Chemical Society 9875-9880 (2005) (Year: 2005).*
V. Kalavakunda, et.al. 5, Nanotechnology Reviews, 369-376 (2016) (Year: 2016).*
Oxford Dictionary of English (Angus Stevenson ed., 3th ed., 2010) (Year: 2010).*
R. Giacomo, et al. 46, Chemical Society Reviews 4400-4416 (2017) (Year: 2017).*
L. Sun, 27, Chinese Journal of Chemical Engineering 2251-2260(2019) (Year: 2019).*
Eleazer, et al., Comments on Inorganic Chemistry 1-30 (2018) (Year: 2018).*
Murthy "New Members of the Periodic Table." 40-41 (2017) (Year: 2017).*
Z. Zhu et al., 9 Nano-Micro Lett. (2017) (Year: 2017).*
W. Yu et al., 350 Coordination Chemistry Reviews, 300-319 (2017) (Year: 2017).*
Z. Qiu et al., Dalton Transaction, 4925-4934 (2014) (Year: 2014).*
B. Stibr, 92 Chemical Reviews, 225-250 (1992) (Year: 1992).*
Y. Awasa et al., 26 Molecules (2021) (Year: 2021).*
A. Welch et al., 7 Crystals (2017) (Year: 2017).*
A. Olejniczak et al., 19 International Journal of Molecular Sciences (2018) (Year: 2018).*
Zhu—Nano-Micro Lett. (2017) 9:25 (Year: 2017).*
The International Search Report (ISR) with Written Opinion for PCT/AU2020/050128 dated Apr. 2, 2020, pp. 1-8.
Kahlert, J. U. et al., 'Site-specific synthesis ofa hybrid boron-graphene salt', Chemical Communications (2016) vol. 52, No. 6, pp. 1290-1292.
Kahlert, J. U. et al., 'Carborane functionalization of the aromatic network in chemically-synthesized graphene', Chemical Communications (2014) vol. 50, No. 77, pp. 11332-11334.
Stengl, V. et al., 'Carborane functionalized graphene oxide, a precursor for conductive self-assembled monolayers', Carbon (2014) vol. 67, pp. 336-343.
Jones, C. J. et al., 'Synthesis of icosahedral metallocarboranes', Inorganic Chemistry (1973) vol. 12, No. 3, pp. 608-610.

* cited by examiner

*Primary Examiner* — Alexander R Pagano
*Assistant Examiner* — Frank S. Hou
(74) *Attorney, Agent, or Firm* — McDonnell Boehnen Hulbert & Berghoff LLP

(57) ABSTRACT

Disclosed herein are complexes comprising graphene compositions thereof. Also disclosed herein are methods of synthesising said complexes and compositions, and the use of said complexes and compositions in, for instance, biomolecular sensing.

18 Claims, 12 Drawing Sheets

GRAPHENE COMPLEXES AND COMPOSITIONS THEREOF

CROSS REFERENCE TO RELATED APPLICATION

This application is a U.S. National Phase of International Application No. PCT/AU2020/050128, filed on Feb. 14, 2020, which claims priority to Australian Patent Application No. 2019900486, filed Feb. 15, 2019, both of which are incorporated by reference herein in their entirety.

TECHNICAL FIELD

Disclosed herein are complexes comprising graphene compositions thereof. Also disclosed herein are methods of synthesising said complexes and compositions, and the use of said complexes and compositions in, for instance, biomolecular sensing.

BACKGROUND

Graphene is an allotrope of carbon and possesses a number of useful attributes. Its constituent carbon atoms have a low molecular mass, and the materials planar morphology and atom bonding arrangement endows it with an extremely large surface area. It displays a high thermal and electrical conductivity, along with exceptional mechanical strength. However, one limitation preventing the application of graphene-based materials for a variety of applications is its chemical robustness.

Graphene, has a two-dimensional structure formed of a mono-layer of carbon atoms tightly packed in honeycomb crystal lattice. That is, graphene has a thickness of only one carbon atom. Each carbon atom is bound by three electrons forming localised bonds to three nearest neighbour carbon atoms, and a fourth electron delocalised over the planar structure, forming an extended sp2-bonded lattice. Graphene is a zero bandgap semiconductor material and electrons propagating through the material behave as massless Dirac fermions.

Graphene displays remarkable electron mobility and the corresponding electric resistivity of graphene is lower than that of copper or silver. In addition, the electron mobility of graphene at room temperature is higher than that found in both carbon nanotubes and silicon crystal. At present, graphene is considered as the material with the lowest resistivity. The thermal conductivity of graphene is arguably greater than that of carbon nanotubes and diamond.

At present it is a great challenge for graphene to be widely implemented in high volumes while retaining combinations of its specialty properties for industrial application.

Graphene is essentially all surface, and combined with its superior properties of strength, high thermal stability, and exceptional conductivity, provides an ideal solid-state interface to perform chemistry. However, the extended aromatic network in graphene remains difficult to access through chemical activation because it is highly inert to many reagents. Most work to date continues to focus on the use of oxidised graphene materials to append functional groups, and reports of covalent bonding to graphene generally involve the grafting of aryl- or nitrogen-based groups. The ability to modify the graphene lattice for further, more complex chemical reactions, such as those involving inorganic compounds with high thermal, oxidative, and chemical stabilities, remains a considerable challenge. Thus, despite progress to date, there are currently limited solutions to the problem of attaching inorganic molecules to the graphene lattice; therefore, new methods are needed. Disclosed here are methods which may overcome at least part of this problem.

In relation to potentially important applications for graphene and/or functionalised graphene, printed electronics has been considered and may offer an attractive alternative in comparison to some conventional technologies. For example they may enable the formation of low cost, large area, flexible devices which have the potential to enable unique advances in varied applications, including as health diagnostics. Key advantages of this technology can potentially include digital and additive patterning, reduction in material waste, and compatibility with a variety of substrates with different degrees of mechanical flexibility and form-factor. Despite any arguable advances in this sector, the ability to pattern low-resistance conducting electrodes with fine resolution remains an important challenge. A specific example of a use for printed electronics is in the field of biosensors, where a biologically relevant event is detected and transmitted accordingly, such that a meaningful signal can be interpreted. However such applications require that the material used is capable of detecting and transmitting signals.

Graphene and in particular tuneable (functionalised) complexes of graphene are arguably important materials worth consideration as a component in printed electronic devices due to their tenability, high conductivity and morphology. In particular, specifically designed graphene based inks could provide an alternative to conventional carbon-based inks that have shown limited conductivity, especially in formulations compatible with inkjet printing. Thus, there is a still a need to enhance the properties of such inks. Thus there remains an on-going search in the art for an improved approach to synthesising and utilising graphene and in particular functionalised forms thereof, in order to identify and apply the benefits and advantages available from graphene and compositions thereof.

SUMMARY

In a first aspect, the invention disclosed herein relates to complexes comprising one or more metallacarboranes bound to a graphene.

In a second aspect, the invention also discloses a process for producing a complex comprising one or more metallacarboranes bound to a graphene, the process comprising the steps of:
  reacting said graphene with a carborane in a dehydrogenation and/or deboronation reaction to obtain a graphene bound with one or more carboranes;
  isolating graphene-bound carborane of step i); and
  contacting the material of step ii) with a strong base and a metal for a time and under conditions to prepare a complex comprising one or more metallacarboranes bound to a graphene.

In a third aspect, disclosed herein is a process for producing a complex comprising one or more metallacarboranes bound to a graphene, the process comprising the steps of:
  reacting said graphene with a carborane in a dehydrogenation and/or deboronation reaction to obtain a graphene bound with one or more carboranes;
  isolating graphene-bound carborane of step i);
  reacting the material of step ii) with caesium fluoride;
  isolating the graphene-carborane complex of step iii); and reacting the isolated material of step iv) in a deboronation reaction with a metal halide for a time and under conditions to prepare a complex comprising one or more metallacarboranes bound to a graphene.

In a fourth aspect, disclosed herein is a complex produced according to the process of the second or third aspects.

In a fifth aspect, disclosed herein is a composition comprising a complex according to the first or fourth aspects and one or more additives.

In a sixth aspect, disclosed herein is a device comprising a surface on which a layer of a complex according to the first or fourth aspects or a composition according to the fifth aspect is printed thereon.

Disclosed herein are methods involving chemical reactions using reagents to synthesise allotropic carbon materials/compositions and their post-synthesis modified derivatives. The reactions may involve chemical transformations of carbon containing reagents to solid carbon materials and ink compositions thereof. The reagents may include common laboratory chemicals like alcohols and hydrocarbons, synthetic compounds like coordination polymers and carboranes, and solid carbon materials. The allotropic carbon materials may include synthetic graphene. The chemically modified derivatives may include inorganic molecules appended to synthetic graphene. The materials may be produced in gram-scale quantities. In one embodiment, the synthesised materials possess at least one of the following attributes: chemically stable at room temperature and pressure (and possibly when exposed to air), the ability to be reproduced over multiple iterations of any disclosed synthetic process, and/or show well-defined chemical, structural, and/or electronic and magnetic characteristics.

Herein, the selective attachment of carboranes (boron analogues of carbon fullerene) to a variety of reactive sites on conductive sp2-bonded carbon surfaces, may be capable of dilute incorporation of d- and f-block metals close to the carbon surface to form metallacarborane-graphene materials. This hierarchal chemical assembly to form carborane-graphene hybrids (and including the derivative metallacarborane-graphene hybrids), may provide an opportunity for fine control over the chemical, electronic, and magnetic properties of solid-state graphene-based materials down to the molecular level. The advantage here is that the materials disclosed herein should be thought of as being "tuneable". Thus the formulation of carborane-graphene inks may provide an opportunity to process high volumes of material with deterministic control over patterning sensitivity and application.

As eluded to above, one of the most important advantages is the ability to process materials with hierarchal chemical function embedded into graphene, as these materials could, in principle, facilitate selective responsiveness to a variety of molecules in nanoscale devices. One such example of the versatility of the chemical functionalisation makes the carborane-graphene materials useful for attaching any protein with a reactive site to metal ions and complexes. As many proteins can cross-link and stabilise in the presence of metal ions, the inks can be versatile to adaption to any kind of protein biosensing, particularly of biomarkers, providing antibodies specific for the protein to be detected are available. Modified graphene-ink surfaces may significantly enhance detection limits and enable highly reproducible and selective detection of clinically important biomarkers. Other advantages are: the materials are an organic-inorganic hybrid which allow for the high thermal, oxidative, and chemical stabilities that is needed to be utilised in nanotechnology; the materials may be biocompatible, the ink formulations introduce the possibility of pattern controlled site-specific conversions at the graphene surface on a range of substrates; minimisation of the number of components in devices, as the carborane-graphene inks are process integrated to form the electronic circuitry; the material can be metal-free (of non-constituents); the inks provide an ease in fabrication and measurement; inks provide greater access to the graphene surface for analytes with the introduction of mobile phases. One such example where a combination of these advantages is useful is in printed and flexible graphene-based inks producing electronic circuitry, where the device components are sensitive to heat or chemical exposure that can damage the physical and chemical properties of the componentry during and after print processing. The ability of functional ink compositions as described herein to be printed together with other components of the final product may make their use advantageous compared to other methods (e.g., lithography etc.) due to: higher throughput since all materials may be printed on the same equipment (e.g., printer); ability to create complex three-dimensional (3D) structures; the ability to seamlessly integrate conductive circuits into the bulk of the final product; simultaneous incorporation of components with single or multiple functionalities; and ease of production, since all components may be produced in one process without or minimum post-printing treatment, etc.

In some regards, it may also be preferable to have biosensing reactions take place as close to the electrode as possible because the products diffuse in all directions, also away from the surface. This results in a decreasing signal with increasing distance to the surface. Graphene, essentially being all surface, may improve this situation.

DESCRIPTION OF EMBODIMENTS

Figure 1:
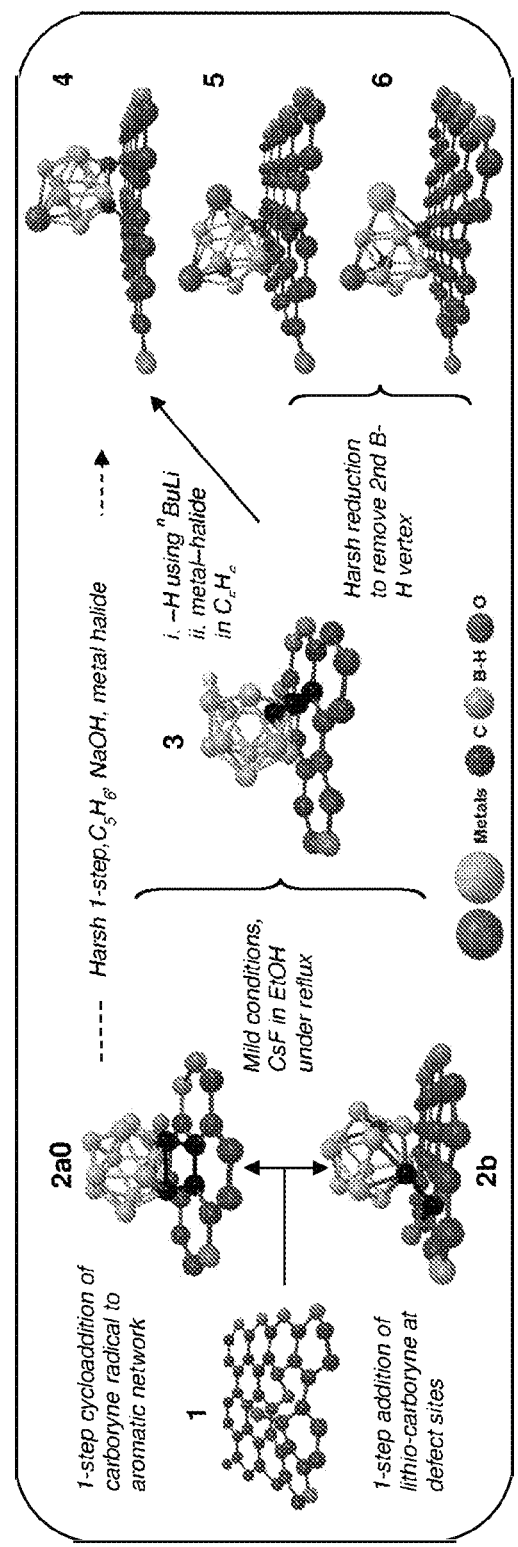
FIG. 1—Exemplary synthetic strategies for forming compositions comprising graphene and at least one carborane.

It will be appreciated that the embodiments of each aspect of the present disclosure may equally be applied to each other aspect, mutatis mutandis.

Definitions

With regards to the definitions provided herein, unless stated otherwise, or implicit from context, the defined terms and phrases include the provided meanings. Unless explicitly stated otherwise, or apparent from context, the terms and phrases below do not exclude the meaning that the term or phrase has acquired by a person skilled in the relevant art. The definitions are provided to aid in describing particular embodiments, and are not intended to limit the claimed invention, because the scope of the invention is limited only by the claims. Furthermore, unless otherwise required by context, singular terms shall include pluralities and plural terms shall include the singular.

Throughout this disclosure, unless specifically stated otherwise or the context requires otherwise, reference to a single step, composition of matter, group of steps or group of compositions of matter shall be taken to encompass one and a plurality (i.e., one or more) of those steps, compositions of matter, groups of steps or groups of compositions of matter. Thus, as used herein, the singular forms "a", "an" and "the" include plural aspects unless the context clearly dictates otherwise. For example, reference to "a" includes a single as well as two or more; reference to "an" includes a single as well as two or more; reference to "the" includes a single as well as two or more and so forth.

Those skilled in the art will appreciate that the disclosure herein is susceptible to variations and modifications other than those specifically described. It is to be understood that the disclosure includes all such variations and modifications. The disclosure also includes all of the steps, features, compositions and compounds referred to or indicated in this specification, individually or collectively, and any and all combinations or any two or more of said steps or features.

Herein a "carborane" is a mixed hydride of boron and carbon containing a polyhedral framework of boron atoms which also includes at least one carbon atom. There are several classes of carboranes, two of these are the closo and nido categories. The prefix "closo" is used to designate those carboranes in which the framework is a complete deltahedron. The prefix "nido" designates those frameworks which are "open", that is, one deltahedral site is incomplete.

Herein "metallacarborane" refers to a carborane that includes at least one metal atom in various combinations, with the metal atom either on the periphery of the carborane skeleton or "sandwiched" by carborane clusters.

Herein an "exo-metallacarborane" refers to a metallacarborane as previously described in which the metal atom is on the periphery of the carborane skeleton.

Herein "endo-metallacarborane" refers to a metallacarborane as previously described in which the metal atom is "sandwiched" by carborane clusters.

Herein, the terms "ink" and "coating" refer to compositions that are in a form suitable for application to a substrate as well as the material after it is applied to the substrate, while it is being applied to the substrate, and both before and after any post-application treatments (such as evaporation, cross-linking, curing, etc.). The components of the ink and coating compositions may vary during these stages. The inks and coatings may optionally further comprise further additives as described herein. The terms "composition", "ink" and "coating" may be used interchangeably herein.

Herein, the term "graphene" refers to pure or relatively pure carbon in the form of a relatively thin, nearly transparent sheet, which is one atom in thickness (i.e., a monolayer sheet of carbon), or comprising multiple layers with no interplanar correlation (multilayer carbon sheets), having a plurality of interconnected hexagonal cells of carbon atoms which form a honeycomb like crystalline lattice structure. In addition to hexagonal cells, pentagonal and heptagonal cells (defects), versus hexagonal cells, may also be present in this crystal lattice. The graphene may be in any form known in the art. For example the graphene may be in a powder form, in the form of a single sheet, or a plurality of sheets.

Herein, the term "functionalised graphene" may refer to graphene which has incorporated into the graphene lattice a variety chemical functional groups such as —OH, —COOH, —NH$_2$, etc., in order to modify the properties of graphene. Alternatively the "functionalised graphene" may refer to functionalised graphene sheets comprising at least one carborane.

Herein, the term "graphene oxide" (also known as "graphitic acid" and "graphite oxide") refers interchangeably to a compound of carbon, oxygen, and hydrogen which may exist in variable ratios of these three atoms, and which may be obtained by treating graphite with strong oxidizers. A person skilled in the art would understand that graphene and graphene oxide are two different materials, for example graphene oxide is brown in appearance, and may have C:O ratios on the order of 3:2 where graphene may be >6:1 (atomic, i.e., 1 oxygen per aromatic ring). In addition, graphene oxide is not conducting, and lacks the delocalised pi electron i.e., saturated.

Herein, the term "dispersion media" or "dispersion solution" refers to a composition, compound, substance, carrier etc., which provides the external or continuous (bulk) phase of a dispersion, for example the dispersion media for an ink as defined herein. The dispersion media may be a liquid, solid, etc. Liquid dispersion media may be solvents, mixtures of solvents, any other substance, composition, compound, etc., which exhibits liquid properties at room or elevated temperatures, etc. Solid dispersion media may be one or more of: polymers (e.g., a solid or melted polymer/polymer melt); glasses; metals; metal oxides; etc.

Herein, "material dispersant", "material dispersing aid" and "material dispersing agent" refer interchangeably to a composition, compound, substance, etc., (e.g., a surfactant) which promotes the dispersion, suspension, separation, etc., of solid graphene materials in the internal (disperse) phase of a dispersion and throughout the external or continuous (bulk) phase of a dispersion.

Herein, "solution" refers to a homogeneous or a relatively homogeneous mixture comprising only one phase wherein the solid material (the solute) is dissolved in another substance (the solvent).

Herein, the term "fillers" refers to additives which may alter a composition or composite's mechanical properties, physical properties, chemical properties, etc.

Herein, "plasticiser" refers to the conventional meaning of this term as an agent which, for example, softens, makes more flexible, malleable, pliable, plastic, etc., a polymer, thus providing flexibility, pliability, durability, etc., which may also decrease the melting and the glass transition temperature of the polymer.

Herein, the term "stabilisers" refers to thermal, oxidative, and/or light stabilisers. Thermal stabilisers refer to additives to a component which improves a composition's resistance to heat, resulting in sustaining a composition's properties at higher temperatures compared to materials without the stabiliser. Oxidative stabilisers refer to additives to a component which improves a composition's resistance to oxidative damage (including alteration of any properties) which may result from, but not limited to, oxidation by atmospheric air, corrosive or other reactive chemicals (e.g., acids, peroxides, hypochlorides, ozone, etc.). Light stabilisers refer to additives which may improve a composition's resistance to damage (including alteration of any properties) resulting from the exposure to natural or artificial light in a wide spectral range (from deep UV to mid IR).

Herein, the term "colorants" refers to compositions, compounds, substances, materials, etc., such as pigments, tints, etc., which causes a change in colour of a substance, material, etc.

Herein, the term "thermal conductivity" refers to the property, capability, capacity, etc., of a material, substance, etc., to conduct heat.

Herein "electrical conductivity" refers to the property, capability, capacity, etc., of a material, substance, etc., to conduct electricity. The electrical conductivity may be measured on various scales, for example on a bulk scale, micron scale or on a nano scale.

The word "about" is used herein when referring to a measurable value such as an amount, and is meant to encompass variations of ±5%, ±1%, or ±0.1%, from the specified value, as such variations are appropriate to perform the disclosed methods.

Throughout the present specification, various aspects and components of the invention can be presented in a range format. The range format is included for convenience and should not be interpreted as an inflexible limitation on the scope of the invention. Accordingly, the description of a range should be considered to have specifically disclosed all the possible sub-ranges as well as individual numerical values within that range, unless specifically indicated. For example, description of a range such as from 1 to 5 should be considered to have specifically disclosed sub-ranges such as from 1 to 3, from 1 to 4, from 1 to 5, from 2 to 4, from 2 to 5, from 3 to 5 etc., as well as individual and partial numbers within the recited range, for example, 1, 2, 3, 4, 5, 5.5 and 6, unless where integers are required or implicit from context. This applies regardless of the breadth of the disclosed range. Where specific values are required, these will be indicated in the specification.

Complexes

Disclosed herein are complexes comprising graphene and one or more carboranes bound to the graphene. In certain embodiments the carborane is a metallacarborane.

Also disclosed herein is a composition in the form of an ink comprising graphene and one or more metallacarboranes, wherein the ink may be used for the production of conductive printed patterns.

In one embodiment the other atoms may be incorporated into the cage structures to give heterocarboranes, thereby expanding the clusters. In one embodiment the metal atom coordinates through a complexing agent, for example a coordination polymer.

Herein two polyhedral structures are described for the carboranes which may be used to form metallacarboranes. The first carborane is where all the cage atoms occupy all the vertices of a closed polyhedron to give a closo-structure, while in the second, one of the vertices is removed to give an open basket-like, nido-structure. Additional geometries known in the art, e.g., arachno- and hypho-, may be obtained by successively removing other vertices from the nido-structure.

The carborane may be bound to the graphene in a variety of ways. For example, both carborane carbon atoms may be directly attached to the aromatic network of graphene. This may be accomplished by initially creating a carborane 'radical'. Alternatively, only one carbon atom from a carborane is attached to the aromatic network of graphene. This can be via nucleophilic sites, which may be an oxygen atom or a vacancy/'dangling bond' i.e., an electron rich defect which is present on a portion of the network of graphene. In some cases, the carborane is sufficiently close to the graphene surface such that it may be considered to be electronically and chemically connected to the graphene surface.

In one embodiment the carborane is a metallacarborane. Herein, the metallacarborane comprises at least one metal atom. In one embodiment the metallacarborane comprises two or more metal atoms, wherein the two metal atoms may be the same or different.

In one embodiment the metallacarborane comprises at least one Group 1 or Group 2 element. For example at least Group 1 or Group 2 element selected from, but not limited to: Li, Na, K, Rb, Cs, Be, Mg, Ca, Sr, Ba, and mixtures thereof.

In one embodiment the metallacarborane comprises at least one element selected from Groups 3 to 12. For example at least one element selected from: Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Jr, Pt, Au, Hg, Rf, db, Sg, Bh, Hs, Mt, Ds, Rg, Cn, and mixtures thereof. In one embodiment, the metallacarborane comprises at least one element selected from: Sc, Ti, V, Cr, Mn, Fe, Co, Ni, Cu, Zn, Ru, Rh, Pd, Ag, Pt, Jr, Au, Y, La, and mixtures thereof. In an embodiment, the metallacarborane comprises Zn. In another embodiment, the metallacarborane comprises Mn. In another embodiment, the metallacarborane comprises Ni. In a further embodiment, the metallacarborane comprises Fe.

In one embodiment the metallacarborane comprises at least one element selected from Group 13 or Group 14. For example at least element selected from, but not limited to: Al, Sn and mixtures thereof.

In another embodiment the metallacarborane comprises at least one lanthanide. For example at least one lanthanide selected from: La, Ce, Pr, Nd, Pm, Sm, Eu, Gd, Tb, Dy, Ho, Er, Tm, Yb, Lu, and mixtures thereof. In one embodiment, the metallacarborane comprises at least one element selected from: Gd, Ce, Nd, Yb and mixtures thereof.

In yet another embodiment the metallacarborane comprises two lanthanides, wherein the lanthanides be the same or different. Each lanthanide may be selected independently from: Gd, Ce, Nd, Yb. In one embodiment the two lanthanides are the same. In another embodiment the two lanthanides are different.

Herein, a lanthanide may be in a +2, +3 or +4 oxidation state. In one embodiment the composition may comprise $Gd^{3+}$.

The carborane utilised in the complexes disclosed herein may be a dicarba-closo-dodecaborane. 1,2-, 1,7- and 1,12-isomers are known to exist. These may be referred to as ortho-carborane, meta-carborane and para-carborane, respectively. Icosahedral carboranes may have high thermal stabilities, be stable in air and potentially exhibit considerable chemical robustness.

The complexes disclosed herein may comprise at least one carborane comprising at least one $[C_2B_{10}H_{11}]$ (i.e. singly bound) or $[C_2B_{10}H_{10}]$ (i.e. doubly bound) unit bound to a graphene surface. The complexes may comprise at least one metallacarborane derived from at least one at least one $[C_2B_{10}H_{11}]$ or $[C_2B_{10}H_{10}]$ unit.

The complexes disclosed herein may comprise at least one carborane or metallacarborane comprising as least one $[C_2B_9H_{11}]^{2-}$ dicarbollide ion bound to a graphene surface. Alternatively, the complexes may comprise at least one carborane or metallacarborane comprising at least two $[C_2B_9H_{11}]^{2-}$ dicarbollide ions bound to a graphene surface. The complexes disclosed herein may comprise anionic 7,8-nido-$[C_2B_9H_{11}]^{-}$ clusters.

The complexes may comprise 1,2-closo-$[C_2B_{10}H_{11}]$ bound to a surface of graphene. The complexes may comprise 1,7-closo-$[C_2B_{10}H_{11}]$ bound to a surface of graphene. The complexes may comprise 1,12-closo-$[C_2B_{10}H_{11}]$ bound to a surface of graphene. The complexes may comprise 1,2-closo-$[C_2B_{10}H_{10}]$ bound to a surface of graphene. The complexes may comprise 1,7-closo-$[C_2B_{10}H_{10}]$ bound to a surface of graphene. The complexes may comprise 1,12-closo-$[C_2B_{10}H_{10}]$ bound to a surface of graphene.

The complexes may comprise a metallacarborane derived from a 1,2-closo-$[C_2B_{10}H_{11}]$ bound to a surface of graphene. The complexes may comprise a metallacarborane derived from a 1,7-closo-$[C_2B_{10}H_{11}]$ bound to a surface of graphene. The complexes may comprise a metallacarborane derived from a 1,12-closo-$[C_2B_{10}H_{11}]$ bound to a surface of graphene.

The complexes may comprise a metallacarborane derived from a 1,2-closo-$[C_2B_{10}H_{10}]$ bound to a surface of graphene. The complexes may comprise a metallacarborane derived from a 1,7-closo-$[C_2B_{10}H_{10}]$ bound to a surface of graphene. The complexes may comprise a metallacarborane derived from a 1,12-closo-$[C_2B_{10}H_{10}]$ bound to a surface of graphene.

Herein, the at least one $[C_2B_9H_{11}]^{2-}$ dicarbollide ion may be: nido-7,8-$[C_2B_9H_{11}]^{2-}$, nido-7,9-$[C_2B_9H_{11}]^{2-}$, nido-2,9-$[C_2B_9H_{11}]^{2-}$, an isomer thereof, or a mixture thereof.

Herein, the complexes may comprise a carborane or metallacarborane derived from: closo-1,2-$[C_2B_{10}H_{12}]$, closo-1,7-$[C_2B_{10}H_{12}]$, closo-1,12-$[C_2B_{10}H_{12}]$, or an isomer thereof, or a mixture thereof.

In one embodiment the closo-carboranes are utilised in the formation of a complex as defined herein. In another embodiment the closo-carborane has the formula $B_{n-2}C_2H_n$ (where n≥5). In one embodiment n is 12. In another embodiment the n is 12 and the carborane is 1,2-carborane.

In an embodiment, the complex comprises a metallacarborane derived from a 1,2-closo-$[C_2B_{10}H_{12}]$ carborane and a metal selected from Groups 3 to 12. In an embodiment, the complex comprises a metallacarborane derived from a 1,2-closo-$[C_2B_{10}H_{12}]$ carborane and a metal selected from the group consisting of Zn, Mn, Ni and Fe. In an embodiment, the complex comprises a metallacarborane derived from a 1,2-closo-$C_2B_{10}H_{12}$ carborane and Zn. In another embodiment, the complex comprises a metallacarborane derived from a 1,2-closo-$[C_2B_{10}H_{12}]$ carborane and Mn. In another embodiment, the complex comprises a metallacarborane derived from a 1,2-closo-$[C_2B_{10}H_{12}]$ carborane and Ni. In another embodiment, the complex comprises a metallacarborane derived from a 1,2-closo-$[C_2B_{10}H_{12}]$ carborane and Fe. In another embodiment, the complex comprises a metallacarborane derived from a 1,2-closo-$[C_2B_{10}H_{12}]$ carborane and a metal selected from the lanthanoids. In an embodiment, the complex comprises a metallacarborane derived from a 1,2-closo-$[C_2B_{10}H_{12}]$ carborane and Gd.

In an embodiment, the complex comprises a metallacarborane derived from a 1,7-closo-$[C_2B_{10}H_{12}]$ carborane and a metal selected from Groups 3 to 12. In an embodiment, the complex comprises a metallacarborane derived from a 1,7-closo-$[C_2B_{10}H_{12}]$carborane and a metal selected from the group consisting of Zn, Mn, Ni and Fe. In an embodiment, the complex comprises a metallacarborane derived from a 1,7-closo-$[C_2B_{10}H_{12}]$carborane and Zn. In another embodiment, the complex comprises a metallacarborane derived from a 1,7-closo-$[C_2B_{10}H_{12}]$carborane and Mn. In another embodiment, the complex comprises a metallacarborane derived from a 1,7-closo-$[C_2B_{10}H_{12}]$ carborane and Ni. In another embodiment, the complex comprises a metallacarborane derived from a 1,7-closo-$[C_2B_{10}H_{12}]$carborane and Fe. In another embodiment, the complex comprises a metallacarborane derived from a 1,7-closo-$[C_2B_{10}H_{12}]$ carborane and a metal selected from the lanthanoids. In an embodiment, the complex comprises a metallacarborane derived from a 1,7-closo-$[C_2B_{10}H_{12}]$carborane and Gd.

In an embodiment, the complex comprises a metallacarborane derived from a 1,12-closo-$[C_2B_{10}H_{12}]$ carborane and a metal selected from Groups 3 to 12. In an embodiment, the complex comprises a metallacarborane derived from a 1,12-closo-$[C_2B_{10}H_{12}]$ carborane and a metal selected from the group consisting of Zn, Mn, Ni and Fe. In an embodiment, the complex comprises a metallacarborane derived from a 1,12-closo-$[C_2B_{10}H_{12}]$ carborane and Zn. In another embodiment, the complex comprises a metallacarborane derived from a 1,12-closo-$[C_2B_{10}H_{12}]$ carborane and Mn. In another embodiment, the complex comprises a metallacarborane derived from a 1,12-closo-$[C_2B_{10}H_{12}]$ carborane and Ni. In another embodiment, the complex comprises a metallacarborane derived from a 1,12-closo-$[C_2B_{10}H_{12}]$ carborane and Fe. In another embodiment, the complex comprises a metallacarborane derived from a 1,12-closo-$[C_2B_{10}H_{12}]$ carborane and a metal selected from the lanthanoids. In an embodiment, the complex comprises a metallacarborane derived from a 1,12-closo-$[C_2B_{10}H_{12}]$ carborane and Gd.

In an embodiment, the complex comprises a metallacarborane derived from a 7,8-nido-$[C_2B_9H_{11}]^{2-}$ carborane and a metal selected from Groups 3 to 12. In an embodiment, the complex comprises a metallacarborane derived from a 7,8-nido-$[C_2B_9H_{11}]^{2-}$ carborane and a metal selected from the group consisting of Zn, Mn, Ni and Fe. In an embodiment, the complex comprises a metallacarborane derived from a 7,8-nido-$[C_2B_9H_{11}]^{2-}$ carborane and Zn. In another embodiment, the complex comprises a metallacarborane derived from a 7,8-nido-$[C_2B_9H_{11}]^{2-}$ carborane and Mn. In another embodiment, the complex comprises a metallacarborane derived from a 7,8-nido-$[C_2B_9H_{11}]^{2-}$ carborane and Ni. In another embodiment, the complex comprises a metallacarborane derived from a 7,8-nido-$[C_2B_9H_{11}]^{2-}$ carborane and Fe. In another embodiment, the complex comprises a metallacarborane derived from a 7,8-nido-$[C_2B_9H_{11}]^{2-}$ carborane and a metal selected from the lanthanoids. In an embodiment, the complex comprises a metallacarborane derived from a 7,8-nido-$[C_2B_9H_{11}]^{2-}$ carborane and Gd.

In an embodiment, the complex comprises a metallacarborane bound to a graphene, where the metallacarborane is bound to the graphene surface by a single bond between an atom of the metallacarborane and an atom on the graphene surface. In other words, the metallacarborane is "singly bound" to the graphene. In another embodiment, the complex comprises a metallacarborane bound to graphene, where the metallacarborane is bound to a graphene surface by two single bonds, where the first single bond is between an atom of the metallacarborane and an atom on the graphene surface and the second single bond is between a different atom of the metallacarborane and a different atom on the graphene surface. In another words, the metallacarborane is "doubly bound" to the graphene.

The present inventors have shown herein that metallacarboranes bearing a variety of different metals having different properties are possible. For example, the metallacarboranes disclosed herein include metals with different oxidation states and electronic spin states and represent various Groups throughout the periodic table. This means that the complex comprising the metallacarborane attached to a graphene surface can have different properties, according to the nature of the metal incorporated into the carborane. In certain embodiments, the metallacarborane contains a metal that is a transition metal. In other embodiments, the metallacarborane contains a metal that is a lanthanoid. In some embodiments, the metallacarborane contains one metal atom. In other embodiments, the metallacarborane contains two metal atoms.

In some embodiments, the metallacarborane and the graphene are covalently bound. In other embodiments, the metallacarborane and the graphene are ionically bound. In other embodiments, the metallacarborane and the graphene are associated together through hydrophobic interactions. In other embodiments, the metallacarborane is physically adsorbed (i.e. physisorption) on the surface of the graphene.

In an embodiment, the complex comprises a metallacarborane singly bound to a graphene surface, wherein the metallacarborane contains a metal from Groups 3 to 12. In another embodiment, the complex comprises a metallacarborane singly bound to a graphene surface, wherein the metallacarborane contains a metal selected from the group consisting of Zn, Mn, Ni and Fe. In another embodiment, the complex comprises a metallacarborane singly bound to a graphene surface, wherein the metallacarborane contains Zn. In another embodiment, the complex comprises a metallacarborane singly bound to a graphene surface, wherein the metallacarborane contains Zn. In another embodiment, the complex comprises a metallacarborane singly bound to a graphene surface, wherein the metallacarborane contains Ni. In another embodiment, the complex comprises a metallacarborane singly bound to a graphene surface, wherein the metallacarborane contains Fe. In another embodiment, the complex comprises a metallacarborane singly bound to a graphene surface, wherein the metallacarborane contains a lanthanoid. In another embodiment, the complex comprises a metallacarborane singly bound to a graphene surface, wherein the metallacarborane contains Gd.

In an embodiment, the complex comprises a metallacarborane doubly bound to a graphene surface, wherein the metallacarborane contains a metal from Groups 3 to 12. In another embodiment, the complex comprises a metallacarborane doubly bound to a graphene surface, wherein the metallacarborane contains a metal selected from the group consisting of Zn, Mn, Ni and Fe. In another embodiment, the complex comprises a metallacarborane doubly bound to a graphene surface, wherein the metallacarborane contains Zn. In another embodiment, the complex comprises a metallacarborane doubly bound to a graphene surface, wherein the metallacarborane contains Zn. In another embodiment, the complex comprises a metallacarborane doubly bound to a graphene surface, wherein the metallacarborane contains Ni. In another embodiment, the complex comprises a metallacarborane doubly bound to a graphene surface, wherein the metallacarborane contains Fe. In another embodiment, the complex comprises a metallacarborane doubly bound to a graphene surface, wherein the metallacarborane contains a lanthanoid. In another embodiment, the complex comprises a metallacarborane doubly bound to a graphene surface, wherein the metallacarborane contains Gd.

The complexes of the present invention containing a metallacarborane bound to a graphene sheet may be described according to the ratio of the metallacarborane to the number of polyaromatic rings on the graphene surface. The number of polyaromatic rings on the surface of graphene is taken to be the number of polyaromatic hexagonal rings on both sides of the graphene surface. Accordingly, in an embodiment, the metallacarboranes are present on the surface of the graphene in a ratio of about 1 to 4 to about 1 to 100. In an embodiment, the metallacarboranes are present on the surface of the graphene in a ratio of about 1 to 4, about 1 to 10, about 1 to 20, about 1 to 50, about 1 to 60, about 1 to 70, about 1 to 80, about 1 to 90 or about 1 to 100.

In one embodiment, in a metallacarborane as described herein, at least one other metal coordination site is filled by at least one ligand which is not a carborane. Alternatively, at least one other metal coordination site is filled by a carbollide ion. In another embodiment, the at least one other metal coordination site is filled with a polycyclic aromatic.

In one embodiment the other metal coordination site is filled by one or more monodentate ligands. Examples of monodentate ligands include, but are not limited to: $F^-$, $Cl^-$, $Br^-$, $I^-$, $H_2O$, $NH_3$, $OH^-$, CO, $CN^-$, $SCN^-$, and mixtures thereof.

In one embodiment the other metal coordination site is filled by one or more bidentate ligands. Examples of bidentate ligands include, but are not limited to: ethylene diamine, oxalate, bipyridine, ortho-phenanthroline, carbonate, and mixtures thereof.

In one embodiment the other metal coordination site is filled by one or more polydentate ligands. Examples of polydentate ligands include, but are not limited to: ethylenediaminetetraacetic acid, trithylenetriamine, triethylenetetramine, and mixtures thereof. In another embodiment, the ligand may be a cyclopentadiene.

In one embodiment the one or more carborane units in at least one metallacarborane are substituted, for example in the 1,3, 1,4 or 1,5 positions. Examples of substitutions include, but are not limited to: alkyl, alkenyl, alkynyl, aryl, heteroaryl, heterocyclyl, and mixtures thereof. For functionalised carborane units, the substituents may be optionally substituted themselves. The functionalisation may or may not be symmetrical.

In one embodiment at least two carborane units in at least one metallacarborane are substituted are linked, for example in the in the 1,3, 1,4 or 1,5 positions. Examples of linking moieties includes, but is not limited to: phenyl, pyridyl, triazyl, B(OH), CO, SO, $CH_2$, B(Ph), coordination polymers, and mixtures thereof.

In yet another embodiment, the ink composition is not a salt.

In one embodiment the carborane is stable at a temperature of at least about 100° C.; or at least about 120° C.; or at least about 140° C.; or at least about 160° C.; or at least about 180° C.; or at least about 200° C.; or at least about 220° C.; or at least about 240° C.; or at least about 260° C.; or at least about 280° C.; or at least about 300° C.; or at least about 320° C.; or at least about 340° C.; or at least about 360° C.; or at least about 380° C.; or at least about 400° C.; or at least about 420° C.; or at least about 440° C.; or at least about 460° C.; or at least about 480° C.; or at least about 500° C.; or at least about 520° C.; or at least about 540° C.; or at least about 560° C.; or at least about 580° C.; or at least about 600° C.; or at least about 620° C.; or at least about 640° C.; or at least about 660° C.

The concentration of the carborane and/or metallacarborane may be quantified using any technique known in the art. For example, X-ray photoelectron spectroscopy may be used. Analytical techniques such as Atomic Force Microscopy (AFM) and Transmission Electron Microscopy (TEM) can show, inter alia, 1 nm cages on a surface. Nuclear Magnetic Resonance (NMR) spectroscopy, may be used to characterise its molecular make up and structure.

Herein the graphene is utilised in the formation of the disclosed compositions.

In one embodiment the graphene is synthesised by, but not limited to: exfoliation, dispersion, chemical reduction, epitaxial growth, chemical synthesis, or a combination thereof. In another embodiment, graphite may be used, with at least one of modification technique selected from, but not limited to: oxidation, reduction, exfoliation, solvothermal (chemical) synthesis, or a mixture thereof.

In another embodiment the graphene disclosed herein comprises one or more chemical and physical defects selected from, but not limited to: —OH, —COOH, $NH_2$=O, —COO, lone pair of electrons 'dangling bonds', and a mixture thereof. The graphene sheets may be polycrystalline 'in-plane'.

The graphene sheets may have a surface area between about 400 to about 2600 $m^2/g$. The surface area includes all values and sub-values there between. For example the surface area may be, but not limited to: at least about 100 $m^2/g$; or at least about 150 $m^2/g$; or at least about 200 $m^2/g$; or at least about 250 $m^2/g$; or at least about 300 $m^2/g$; or at least about 350 $m^2/g$; or at least about 400 $m^2/g$; or at least about 450 $m^2/g$; or at least about 500 $m^2/g$; or at least about 550 $m^2/g$; or at least about 600 $m^2/g$; or at least about 650 $m^2/g$; or at least about 700 $m^2/g$; or at least about 750 $m^2/g$; or at least about 800 $m^2/g$; or at least about 850 $m^2/g$; or at least about 900 $m^2/g$; or at least about 950 $m^2/g$; or at least about 1000 $m^2/g$; or at least about 1050 $m^2/g$; or at least about 1100 $m^2/g$; or at least about 1150 $m^2/g$; or at least about 1200 $m^2/g$; or at least about 1250 $m^2/g$; or at least about 1300 $m^2/g$; or at least about 1350 $m^2/g$; or at least about 1400 $m^2/g$; or at least about 1450 $m^2/g$; or at least about 1500 $m^2/g$; or at least about 1550 $m^2/g$; or at least about 1600 $m^2/g$; or at least about 1650 $m^2/g$; or at least about 1700 $m^2/g$; or at least about 1750 $m^2/g$; or at least about 1800 $m^2/g$; or at least about 1850 $m^2/g$; or at least about 1900 $m^2/g$; or at least about 1950 $m^2/g$; or at least about 2000 $m^2/g$; or at least about 2050 $m^2/g$; or at least about 2100 $m^2/g$; or at least about 2150 $m^2/g$; or at least about 2200 $m^2/g$; or at least about 2250 $m^2/g$; or at least about 2300 $m^2/g$; or at least about 2350 $m^2/g$; or at least about 2400 $m^2/g$; or at least about 2450 $m^2/g$; or at least about 2500 $m^2/g$; or at least about 2550 $m^2/g$; or at least about 2600 $m^2/g$.

Surface area can be measured using a technique known in the art. For example, by using the nitrogen adsorption/BET method at a suitable temperature (e.g., 77 K) or a methylene blue (MB) dye method in liquid solution.

Compositions of the present invention may be printed using the appropriate apparatus. For example, where the composition is in the form an "ink", the composition may be "printed" on to a surface by use of a suitable apparatus for such printing. In order to avoid blocking an apparatus that is used to print the compositions, the size of the graphene may be restricted, for example by use of filters. In one embodiment the graphene may be less than about 1 µm in all dimensions. For example the graphene used in the ink compositions, methods and used described herein may be used in the form of a ribbon. In one embodiment the maximum size of any one of the length, width and height of a graphene material is less than or equal to: about 1000 nm; or about 900 nm; or about 800 nm; or about 700 nm; or about 600 nm; or about 500 nm; or about 400 nm; or about 300 nm; or about 200 nm; or about 100 nm; or about 90 nm; or about 80 nm; or about 70 nm; or about 60 nm; or about 50 nm; or about 40 nm; or about 30 nm; or about 20 nm; or about 10 nm.

The graphene sheets may have a bulk density of from about 1.90 $g/cm^3$ to about 2.30 $g/cm^3$. For example a bulk density of: at least about 1.90 $g/cm^3$; or at least about 1.95 $g/cm^3$; or at least about 2.00 $g/cm^3$; or at least about 2.05 $g/cm^3$; or at least about 2.10 $g/cm^3$; or at least about 2.15 $g/cm^3$; or at least about 2.20 $g/cm^3$; or at least about 2.25 $g/cm^3$; or at least about 2.30 $g/cm^3$.

In one embodiment the graphene is functionalised. In another embodiment, the graphene may be structurally modified. For example, the graphene may be modified by the inclusion other non-carbon atoms. In an embodiment, the graphene contains a heteroatom. In another embodiment, the graphene contains oxygen atoms. In another embodiment, the graphene contains oxygen-based functional groups.

In one embodiment the graphene comprises or consists of graphene oxide. In another the embodiment the graphene does not comprise, or does not consist of graphene oxide. In another embodiment, the graphene is oxygenated graphene. In another embodiment, the graphene is structurally modified oxygenated graphene. In another embodiment, the graphene is graphene structurally modified in air.

The graphene sheets may be functionalised with, for example, oxygen-containing functional groups (including, for example, hydroxyl, carboxyl, and epoxy groups). The overall carbon to oxygen molar ratio (C/O ratio), as determined by bulk elemental analysis, may be at least about 6:1. For example the C/O ratio may be at least 7:1; or at least 8:1, or at least 9:1, or at least 10:1; or at least 11:1; or at least 12:1; or at least 13:1; or at least 14:1; or at least 15:1.

Examples of carbon to oxygen atomic ratios include about 3:2 to about 85:15; about 3:2 to about 20:1; about 3:2 to about 30:1; about 3:2 to about 40:1; about 3:2 to about 60:1; about 3:2 to about 80:1; about 3:2 to about 100:1; about 3:2 to about 200:1; about 3:2 to about 500:1; about 3:2 to about 1000:1; about 3:2 to greater than 1000:1; about 10:1 to about 30:1; about 80:1 to about 100:1; about 20:1 to about 100:1; about 20:1 to about 500:1; about 20:1 to about 1000:1; about 50:1 to about 300:1; about 50:1 to about 500:1; and about 50:1 to about 1000:1. In some embodiments, the carbon to oxygen ratio is at least about 10:1; or at least about 15:1; or at least about 20:1; or at least about 35:1; or at least about 50:1; or at least about 75:1; or at least about 100:1; or at least about 200:1; or at least about 300:1; or at least about 400:1; or at least 500:1; or at least about 750:1; or at least about 1000:1; or at least about 1500:1; or at least about 2000:1. The carbon to oxygen ratio also includes all values and sub-values between these ranges.

The graphene sheets may contain atomic scale corrugations. These corrugations may be caused by the presence of lattice defects in, or by chemical functionalisation of the in-plane two-dimensional hexagonal lattice structure.

The physical properties of the graphene may be dependent on the form of the graphene. For example where the graphene is in the form of a sheet as opposed to a bulk powder. A graphene sheet may be: flat, corrugated, curved, in an extended three-dimensional structure and/or with no interplanar correlation. The defect density may be one defect per ten rings, or less. The accessible surface area for the graphene may also vary, for example: in a solid state it may be ~500 m$^2$/g; in a liquid it may be >500 m$^2$/g; and theoretically it may be ~2600 m$^2$/g on a single sheet.

The graphene may have an oxygen content of less than about 16% by weight. For example, an oxygen content of, but not limited to: less than about 15.5% by weight; or less than about 15.0% by weight; or less than about 14.5% by weight; or less than about 14.0% by weight; or less than about 13.5% by weight; or less than about 13.0% by weight; or less than about 12.5% by weight; or less than about 12.0% by weight; or less than about 11.5% by weight; or less than about 11.0% by weight; or less than about 10.5% by weight; or less than about 10.0% by weight; or less than about 9.5% by weight; or less than about 9.0% by weight; or less than about 8.5% by weight; or less than about 8.0% by weight; or less than about 7.5% by weight; or less than about 7.0% by weight; or less than about 6.5% by weight; or less than about 6.0% by weight; or less than about 5.5% by weight; or less than about 5.0% by weight.

In one embodiment the graphene fulfils at least one of the following parameters:
- an oxygen content of less than about 16% by weight;
- a carbon content of greater than about 83% by weight;
- less than about 10 layers;
- has greater than about 99% graphene content by morphology;
- have a bulk conductivity of greater than about 100 S/m at room temperature; and/or
- the solid material is stable in air.

The graphene sheets may be formed in the shape of a flake.

The thickness of the graphene sheets may be about 0.335 to about 3.35 nm. Alternatively, the thickness of the sheet may be selected from, but not limited to: at least about 0.3 nm; or at least about 0.4 nm; or at least about 0.5 nm; or at least about 0.6 nm; or at least about 0.7 nm; or at least about 0.8 nm; or at least about 0.9 nm; or at least about 1 nm; or at least about 1.1 nm; or at least about 1.2 nm; or at least about 1.3 nm; or at least about 1.4 nm; or at least about 1.5 nm; or at least about 1.6 nm; or at least about 1.7 nm; or at least about 1.8 nm; or at least about 1.9 nm; or at least about 2 nm; or at least about 2.1 nm; or at least about 2.2 nm; or at least about 2.3 nm; or at least about 2.4 nm; or at least about 2.5 nm; or at least about 2.6 nm; or at least about 2.7 nm; or at least about 2.8 nm; or at least about 2.9 nm; or at least about 3 nm; or at least about 3.1 nm; or at least about 3.2 nm; or at least about 3.3 nm; or at least about 3.4 nm; or at least about 3.5 nm.

The lateral size of the graphene sheets may be about 0.1 to about 10 μm. For example, the lateral size of the graphene sheets may be selected from, but not limited to: at least about 0.1 μm; or at least about 0.5 μm; or at least about 1 μm; or at least about 1.5 μm; or at least about 2 μm; or at least about 2.5 μm; or at least about 3 μm; or at least about 3.5 μm; or at least about 4 μm; or at least about 4.5 μm; or at least about 5 μm; or at least about 5.5 μm; or at least about 6 μm; or at least about 6.5 μm; or at least about 7 μm; or at least about 7.5 μm; or at least about 8 μm; or at least about 8.5 μm; or at least about 9 μm; or at least about 9.5 μm; or at least about 10 μm.

Compositions

Disclosed herein are compositions of a complex comprising one or more carboranes bound to a graphene. In some embodiments, the carborane of the compositions are metallacarboranes.

Disclosed herein is a composition, in the form of an ink, wherein the ink composition comprises graphene and at least one carborane.

Also disclosed herein is a composition, in the form of an ink, wherein the ink composition comprises graphene and at least one metallacarborane.

In addition to the inclusion of a carborane and/or a metallacarborane, the properties of the graphene used herein may also be enhanced by the use of material dispersants and solvents. These additional components may improve the mechanical, physical, chemical and other properties of the graphene dispersion, as well as enhancing the electrical and thermal conductivity of graphene dispersion for selected applications.

Herein, the compositions optionally further comprise one more additional components or additives. Examples of the additional components includes, but is not limited to: a dispersion solution; dispersion media; material dispersant; filler; plasticiser; impact modifier; binder; flame retardant; stabiliser; surfactant; colorant, and mixtures thereof.

In one embodiment the composition comprises a dispersion solution and/or a dispersion media. Liquid dispersion media may be solvents, mixtures of solvents, any other substance, composition, compound, etc., which exhibits liquid properties at room or elevated temperatures, etc. Solid dispersion media may be one or more of: polymers (e.g., a solid or melted polymer/polymer melt); glasses; metals; metal oxides; etc. Suitable polymers for use as solid dispersion media or as melted polymer/polymer melts may include, for example, one or more of: acrylate or methylmethacrylate polymers or copolymers, such as polyacrylates, polymethylmethacrylates, etc.; polylactic acid (PLA) polymers; polyhydroxyalkanoate (PHA) polymers, such as polyhydroxybutyrate (PHB); polycaprolactone (PCL) polymers; polyglycolic acid polymers; acrylonitrile-butadiene-styrene polymers (ABS); polyvinylidene fluoride polymers, polyurethane polymers, polyolefin polymers (e.g., polyethylene, polypropylene, etc.), polyester polymers, polyamide polymers, etc.

In one embodiment the composition comprises a dispersion solution that comprises at least one solvent, which may be selected from a group consisting of water, organic solvent, or ionic solution. The dispersion solution may further comprise an additional reagent, such as a surfactant and/or a dispersant. The additional reagent may be added into the solvent to adjust the surface tension of the dispersion solution. In one embodiment the additional reagent may be selected, but not limited to, at least one of: organic acids, alcohols, aldehydes, esters, amines, inorganic bases and inorganic salts.

Examples of solvents into which the graphene and carborane/metallacarborane components can be dispersed include, but is not limited to: water, distilled or synthetic iso-paraffinic hydrocarbons (such Isopar® and Norpar® (both manufactured by Exxon) and Dowanol® (manufactured by Dow), citrus terpenes and mixtures containing citrus terpenes (such as Purogen, Electron, and Positron (all manufactured by Ecolink)), terpenes and terpene alcohols (including terpineols, including alpha-terpineol), limonene, aliphatic petroleum distillates, alcohols (such as methanol, ethanol, n-propanol, iso-propanol, n-butanol, sec-butanol, t-butanol, pentanols, hexanols, heptanols, octanols, diacetone alcohol, butyl glycol, etc.), ketones (such as acetone, methyl ethyl ketone, cyclohexanone, 2,6,8,trimethyl-4-nonanone etc.), esters (such as methyl acetate, ethyl acetate, n-propyl acetate, n-butyl acetate, tert-butyl acetate, sec-butyl acetate, carbitol acetate, etc.), glycol ethers, ester and alcohols (such as 2-(2-ethoxyethoxy)ethanol, propylene glycol monomethyl ether and other propylene glycol ethers; ethylene glycol monobutyl ether, 2-methoxyethyl ether (diglyme), propylene glycol methyl ether (PGME); and other ethylene glycol ethers; ethylene and propylene glycol ether acetates, diethylene glycol monoethyl ether acetate, 1-methoxy-2-propanol acetate (PGMEA); and hexylene glycol (such as Hexasol™ (supplied by SpecialChem)), dibasic esters (such as dimethyl succinate, dimethyl glutarate, dimethyl adipate), dimethylsulfoxide (DMSO), 1,3-dimethyl-3, 4,5,6-tetrahydro-2(1H)-pyrimidinone (DMPU), imides, amides (such as dimethylformamide (DMF), dimethylacetamide, etc.), cyclic amides (2-pyrrolidone), lactones (such as beta-propiolactone, gamma-valerolactone, delta-valerolactone, gamma-butyrolactone, epsilon-caprolactone), cyclic imides (such as imidazolidinones such as N,N'-dimethylimidazolidinone (1,3-dimethyl-2-imidazolidinone)), aromatic solvents and aromatic solvent mixtures (such as toluene, xylenes, mesitylene, cumene, etc.), petroleum distillates, naphthas (such as VM&P naphtha), and mixtures of two or more of the foregoing and mixtures of one or more of the foregoing with other carriers. Solvents can be low- or non-VOC solvents, non-hazardous air pollution solvents, and non-halogenated solvents. In one embodiment a combination of toluene and ethanol may be used, for example an 80:20 toluene:ethanol solution. In another embodiment a combination of terpineol and cyclohexanone may be used, for example a 15:85 terpineol:cyclohexanone solution.

In another embodiment the composition comprises at least one material dispersant. Examples include, but are not limited to, one or more of: ethyl cellulose; cellulose triacetate; sodium taurodeoxycholate; sodium taurocholate; or trisilanols (e.g., POSS® trisilanols (polyhedral organomeric silsesquinoxane), and mixtures thereof. In one embodiment the material dispersant is ethyl cellulose.

In another embodiment the composition comprises at least one filler. Examples include, but are not limited to, one or more of: magnesium oxide, hydrous magnesium silicate, aluminium oxides, silicon oxides, titanium oxides, calcium carbonate, clay, chalk, boron nitride, limestone, diatomaceous earth, mica, glass quartz, ceramic and/or glass microbeads, metal or metal oxide fibres and particles, Magnetite®, magnetic Iron(III) oxide, carbon nanotubes and/or fibres, etc., and mixtures thereof.

In another embodiment the composition comprises at least one plasticiser. Examples include, but are not limited to, one or more of: tributyl citrate, acetyl tributyl citrate, diethyl phthalate, glycerol triacetate, glycerol tripropionate, triethyl citrate, acetyl triethyl citrate, phosphate esters (e.g., triphenyl phosphate, resorcinol bis(diphenyl phosphate), oligomeric phosphate, etc.), long chain fatty acid esters, aromatic sulfonamides, hydrocarbon processing oil, propylene glycol, epoxy-functionalized propylene glycol, polyethylene glycol, polypropylene glycol, partial fatty acid ester (Loxiol GMS 95), glucose monoester (Dehydrat VPA 1726), epoxidised soybean oil, acetylated coconut oil, linseed oil, epoxidised linseed oil, etc., and mixtures thereof.

In another embodiment the composition comprises at least one impact modifier. Examples include, but are not limited to, one or more of: polymers or copolymers of an olefin, for example, ethylene, propylene, or a combination of ethylene and propylene, with various (meth)acrylate monomers and/ or various maleic-based monomers; copolymers derived from ethylene, propylene, or mixtures of ethylene and propylene, as the alkylene component, butyl acrylate, hexyl acrylate, propyl acrylate, a corresponding alkyl(methyl) acrylates or a combination of the foregoing acrylates, for the alkyl(meth)acrylate monomer component, with acrylic acid, maleic anhydride, glycidyl methacrylate or a combination thereof as monomers providing an additional moieties (i.e., carboxylic acid, anhydride, epoxy); block copolymers, for example, A-B diblock copolymers and A-B-A triblock copolymers having of one or two aryl alkylene blocks A, which may be polystyrene blocks, and a rubber block, B, which may be derived from isoprene, butadiene or isoprene and butadiene; etc., and mixtures thereof.

In another embodiment the composition comprises at least one stabiliser. In one embodiment the stabiliser is a thermal stabiliser. In another embodiment the stabiliser is an oxidative stabiliser. In yet another embodiment the stabiliser is a light stabiliser. Examples of thermal stabilisers include, but are not limited to, one or more of: a hydrogen chloride scavenger such as epoxidised soybean oil, etc, and mixtures thereof. Examples of oxidative stabilisers include, but are not limited to, one or more of: alkoxy substituted (e.g., propoxy) hindered amine light stabilizers (NOR HALS), N-(1,3-dimethylbutyl)-N'-phenyl-p-phenylenediamine (6PPP), N-isopropyl-N-phenyl-/phenylenediamine (IPPD), 6-ethoxy-2,2,4-trimethyl-1,2-dihydroquinoline (ETMQ), ethylene diurea (EDU), paraffin waxes, etc, and mixtures thereof. Examples of light stabilisers include, but are not limited to, one or more of: ultra violet (UV) light stabilizers, hindered amine light stabilizers (HALS), (HAS), etc., and mixtures thereof.

In yet another embodiment, the ink composition does not comprise a stabiliser. For example, the surface charge of an ink composition, or components contained in the ink composition, may be controlled by pH and/or surface groups.

In another embodiment the ink composition comprises at least one binder, for example at least one polymer binder. Examples of binders include, but are not limited to, one or more of: a thermoplastic resin, a thermoset resin, cellulose and a conductive polymer, or a mixture thereof. The conductive polymer may be a of polythiophene or a polycationic polymer. The binder may be selected from, but not limited to: at least one of: poly(3,4-ethylenedioxythiophene (PEDOT), poly(3,4-ethylenedioxythiophene)-polystyrene sulfonic acid (PEDOT:PSS), polyaniline, polypyrrole, or a mixture or copolymer thereof.

The polymeric binders may be crosslinked or otherwise cured after an ink or coating described herein is applied to a substrate. Examples of polymers include, but are not limited to polyolefins (such as polyethylene, linear low density polyethylene (LLDPE), low density polyethylene (LDPE), high density polyethylene, polypropylene, and olefin copolymers), styrene/butadiene rubbers (SBR), styrene/ethylene/butadiene/styrene copolymers (SEBS), butyl rubbers, ethylene/propylene copolymers (EPR), ethylene/propylene/diene monomer copolymers (EPDM), polystyrene (including high impact polystyrene), polyvinyl acetates), ethylene/vinyl acetate copolymers (EVA), polyvinyl alcohols), ethylene/vinyl alcohol copolymers (EVOH), polyvinyl butyral) (PVB), polyvinyl formal), poly(methyl methacrylate) and other acrylate polymers and copolymers (such as methyl methacrylate polymers, methacrylate copolymers, polymers derived from one or more acrylates, methacrylates, ethyl acrylates, ethyl methacrylates, butyl acrylates, butyl methacrylates, glycidyl acrylates and methacrylates and the like), olefin and styrene copolymers, acrylonitrile/butadiene/styrene (ABS), styrene/acrylonitrile polymers (SAN), styrene/maleic anhydride copolymers, isobutylene/maleic anhydride copolymers, ethylene/acrylic acid copolymers, poly(acrylonitrile), polyvinyl acetate) and polyvinyl acetate) copolymers, polyvinyl pyrrolidone) and polyvinyl pyrrolidone) copolymers, vinyl acetate and vinyl pyrrolidone copolymers, polycarbonates (PC), polyamides, polyesters, liquid crystalline polymers (LCPs), poly(lactic acid) (PLA), poly(phenylene oxide) (PPO), PPO-polyamide alloys, polysulphone (PSU), polysulfides, polyetherketone (PEK), polyetheretherketone (PEEK), polyimides, polyoxymethylene (POM) homopolymers and copolymers, polyetherimides, fluorinated ethylene propylene polymers (FEP), polyvinyl fluoride), poly(vinylidene fluoride), poly(vinylidene chloride), polyvinyl chloride) (PVC), polyurethanes (thermoplastic and thermosetting (including crosslinked polyurethanes such as those crosslinked amines, etc.), aramides (such as Kevlar® and Nomex®), polysulfides, polytetrafluoroethylene (PTFE), polysiloxanes (including polydimethylenesiloxane, dimethylsiloxane/vinylmethylsiloxane copolymers, vinyldimethylsiloxane terminated poly(dimethylsiloxane), etc.), elastomers, epoxy polymers (including crosslinked epoxy polymers such as those crosslinked with polysulfones, amines, etc.), polyureas, alkyds, cellulosic polymers (such as nitrocellulose, ethyl cellulose, ethyl hydroxyethyl cellulose, carboxymethyl cellulose, cellulose acetate, cellulose acetate propionates, and cellulose acetate butyrates), polyethers (such as poly(ethylene oxide), poly(propylene oxide), poly(propylene glycol), oxide/propylene oxide copolymers, etc.), acrylic latex polymers, polyester acrylate oligomers and polymers, polyester diol diacrylate polymers, UV-curable resins, etc. Examples of elastomers include, but are not limited to, polyurethanes, copolyetheresters, rubbers (including butyl rubbers and natural rubbers), styrene/butadiene copolymers, styrene/ethylene/butadiene/styrene copolymer (SEBS), polyisoprene, ethylene/propylene copolymers (EPR), ethylene/propylene/diene monomer copolymers (EPDM), polysiloxanes, and polyethers (such as poly(ethylene oxide), poly(propylene oxide), and their copolymers).

Examples of polyamides include, but arm not limited to, aliphatic polyamides (such as polyamide 4,6; polyamide 6,6; polyamide 6; polyamide 11; polyamide 12; polyamide 6,9; polyamide 6,10; polyamide 6,12; polyamide 10,10; polyamide 10,12; and polyamide 12,12), alicyclic polyamides, and aromatic polyamides (such as poly(m-xylylene adipamide) (polyamide MXD,6)) and polyterephthalamides such as poly(dodecamethylene terephthalamide) (polyamide 12,T), poly(decamethylene terephthalamide) (polyamide 10,T), poly(nonamethylene terephthalamide) (polyamide 9,T), the polyamide of hexamethylene terephthalamide and hexamethylene adipamide, the polyamide of hexamethyleneterephthalamide, and 2-methylpentamethyleneterephthalamide), etc. The polyamides may be polymers and copolymers (i.e., polyamides having at least two different repeat units) having melting points between about 120 and 255° C. including aliphatic copolyamides having a melting point of about 230° C. or less, aliphatic copolyamides having a melting point of about 210° C. or less, aliphatic copolyamides having a melting point of about 200° C. or less, aliphatic copolyamides having a melting point of about 180° C. or less, etc. Examples of these include those sold under the trade names Macromelt by Henkel and Versamid by Cognis.

Examples of acrylate polymers include those made by the polymerization of one or more acrylic acids (including acrylic acid, methacrylic acid, etc.) and their derivatives, such as esters. Examples include methyl acrylate polymers, methyl methacrylate polymers, and methacrylate copolymers. Examples include polymers derived from one or more acrylates, methacrylates, acrylic acid, methacrylic acid, methyl acrylate, methyl methacrylate, ethyl acrylate, ethyl methacrylate, butyl acrylate, butyl methacrylate, glycidyl acrylate, glycidyl methacrylates, 2-ethylhexyl acrylate, 2-ethylhexyl methacrylate, hydroxyethyl acrylate, hydroxyethyl (meth)acrylate, acrylonitrile, and the like. The polymers may comprise repeat units derived from other monomers such as olefins (e.g., ethylene, propylene, etc.), vinyl acetates, vinyl alcohols, vinyl pyrrolidones, etc. They may include partially neutralized acrylate polymers and copolymers (such as ionomer resins).

Examples of polyesters include, but are not limited to, poly(butylene terephthalate) (PBT), poly(ethylene terephthalate) (PET), poly(1,3-propylene terephthalate) (PPT), poly(ethylene naphthalate) (PEN), poly(cyclohexanedimethanol terephthalate) (PCT)), etc.

In one embodiment the composition disclosed herein may comprise one or more adhesion promotors. Examples of adhesion promoters include titanium chelates and other titanium compounds such as titanium phosphate complexes (including butyl titanium phosphate), titanate esters, diisopropoxy titanium bis(ethyl-3-oxobutanoate, isopropoxy titanium acetylacetonate, and others sold by Johnson-Matthey Catalysts under the trade name Vertec.

In one embodiment the composition disclosed herein may comprise one or more thickening agents. Examples of thickening agents include glycol ethers (such as poly(ethylene oxide), block copolymers derived from ethylene oxide and propylene oxide (such as those sold under the trade name Pluronic® by BASF), long-chain carboxylate salts (such aluminium, calcium, zinc, etc. salts of stearates, oleats, palmitates, etc.), aluminosilicates (such as those sold under the Minex® name by Unimin Specialty Minerals and Aerosil® 9200 by Evonik Degussa), fumed silica, natural and synthetic zeolites, etc.

The composition may be manufactured by any process known in the art. For example graphene and at least one carborane may be mixed together, optionally in the presence of a solvent and/or dispersant. Sonication, stirring and/or heating may be utilised in the formation of the ink compositions.

Herein, the composition may comprise graphene and a solvent. The ink composition may comprise graphene in an amount of about 3.5 mg/mL, for example in a solvent comprising cyclohexanone and terpineol, optionally a solvent of 85% cyclohexanone and 15% terpineol. In another embodiment, the graphene is present in an ink composition in an amount of: at least about 0.2 mg/mL; or at least about 0.4 mg/mL; or at least about 0.6 mg/mL; or at least about 0.8 mg/mL; or at least about 1 mg/mL; or at least about 1.2 mg/mL; or at least about 1.4 mg/mL; or at least about 1.6 mg/mL; or at least about 1.8 mg/mL; or at least about 2 mg/mL; or at least about 2.2 mg/mL; or at least about 2.4 mg/mL; or at least about 2.6 mg/mL; or at least about 2.8 mg/mL; or at least about 3 mg/mL; or at least about 3.2 mg/mL; or at least about 3.4 mg/mL; or at least about 3.6 mg/mL; or at least about 3.8 mg/mL; or at least about 4 mg/mL; or at least about 4.2 mg/mL; or at least about 4.4 mg/mL; or at least about 4.6 mg/mL; or at least about 4.8 mg/mL; or at least about 5 mg/mL.

The carborane or metallacarborane may be about 1, 2, 3, 4, 5, 6, 7, 8, 9 or 10% by weight of the graphene in an ink composition described herein. In one embodiment the carborane may be present in an ink composition in an amount of: at least about 0.02 mg/mL; or at least about 0.04 mg/mL; or at least about 0.06 mg/mL; or at least about 0.08 mg/mL; or at least about 0.1 mg/mL; or at least about 0.12 mg/mL; or at least about 0.14 mg/mL; or at least about 0.16 mg/mL; or at least about 0.18 mg/mL; or at least about 0.2 mg/mL; or at least about 0.22 mg/mL; or at least about 0.24 mg/mL; or at least about 0.26 mg/mL; or at least about 0.28 mg/mL; or at least about 0.3 mg/mL; or at least about 0.32 mg/mL; or at least about 0.34 mg/mL; or at least about 0.36 mg/mL; or at least about 0.38 mg/mL; or at least about 0.4 mg/mL; or at least about 0.42 mg/mL; or at least about 0.44 mg/mL; or at least about 0.46 mg/mL; or at least about 0.48 mg/mL; or at least about 0.5 mg/mL.

The compositions, inks and coatings described herein may be applied to a wide variety of substrates, including, but not limited to, flexible and/or stretchable materials, silicones and other elastomers and other polymeric materials, metals (such as aluminium, copper, steel, stainless steel, etc.), adhesives, heat-sealable materials (such as cellulose, biaxially oriented polypropylene (BOPP), poly(lactic acid), polyurethanes, etc.), fabrics (including cloths) and textiles (such as cotton, wool, polyesters, rayon, etc.), plastics (such as polyimide films, polyethylene terephthalate (PET), etc.), clothing, glasses and other minerals, ceramics, silicon surfaces, wood, paper, cardboard, paperboard, cellulose-based materials, glassine, labels, silicon and other semiconductors, laminates, corrugated materials, concrete, bricks, and other building materials, etc. Substrates can in the form of films, papers, wafers, larger three-dimensional objects, etc. In one embodiment the substrate comprises paper, a polyimide and/or PET.

The substrates used with the compositions, inks and coatings described herein, may have been treated with other coatings (such as paints) or similar materials before the inks and coatings are applied. Examples include substrates (such as PET) coated with indium tin oxide, antimony tin oxide, etc. They may be woven, nonwoven, in mesh form; etc.

The substrates may be paper-based materials generally (including paper, paperboard, cardboard, glassine, etc.). Paper-based materials can be surface treated. Examples of surface treatments include coatings such as polymeric coatings, which can include PET, polyethylene, polypropylene, acetates, nitrocellulose, etc. Coatings may be adhesives. Paper based materials may be sized.

Examples of polymeric materials include, but are not limited to: those comprising thermoplastics and thermosets, including elastomers and rubbers (including thermoplastics and thermosets), silicones, fluorinated polysiloxanes, natural rubber, butyl rubber, chlorosulfonated polyethylene, chlorinated polyethylene, styrene/butadiene copolymers (SBR), styrene/ethylene/butadiene/stryene copolymers (SEBS), styrene/ethylene/butadiene/stryene copolymers grafted with maleic anhydride, styrene/isoprene/styrene copolymers (SIS), polyisoprene, nitrile rubbers, hydrogenated nitrile rubbers, neoprene, ethylene/propylene copolymers (EPR), ethylene/propylene/diene copolymers (EPDM), ethylene/vinyl acetate copolymer (EVA), hexafluoropropylene/vinylidene fluoride/tetrafluoroethylene copolymers, tetrafluoroethylene/propylene copolymers, fluorelastomers, polyesters (such as poly(ethylene terephthalate), poly(butylene terephthalate), poly(ethylene naphthalate), liquid crystalline polyesters, poly(lactic acid), etc.); polystyrene; polyamides (including polyterephthalamides); polyimides (such as Kapton®); aramids (such as Kevlar® and Nomex®); fluoropolymers (such as fluorinated ethylene propylene (FEP), polytetrafluoroethylene (PTFE), polyvinyl fluoride), poly(vinylidene fluoride), etc.); polyetherimides; polyvinyl chloride); poly(vinylidene chloride); polyurethanes (such as thermoplastic polyurethanes (TPU); spandex, cellulosic polymers (such as nitrocellulose, cellulose acetate, etc.); styrene/acrylonitriles polymers (SAN); arcrylonitrile/butadiene/styrene polymers (ABS); polycarbonates; polyacrylates; poly(methyl methacrylate); ethylene/vinyl acetate copolymers; thermoset epoxies and polyurethanes; polyolefins (such as polyethylene (including low density polyethylene, high density polyethylene, ultrahigh molecular weight polyethylene, etc.), polypropylene (such as biaxially-oriented polypropylene, etc.); Mylar; etc. They may be non-woven materials, such as DuPont Tyvek®. They may be adhesive or adhesive-backed materials (such as adhesive-backed papers or paper substitutes). They may be mineral-based paper substitutes such as Teslin® from PPG Industries. The substrate may be a transparent or translucent or optical material, such as glass, quartz, polymer (such as polycarbonate or poly(meth)acrylates (such as poly(methyl methacrylate).

The inks disclosed herein may be applied to the substrate using any suitable method, including, but not limited to, painting, pouring, spin casting, solution casting, dip coating, powder coating, by syringe or pipette, spray coating, curtain coating, lamination, co-extrusion, electrospray deposition, ink-jet printing, spin coating, thermal transfer (including laser transfer) methods, doctor blade printing, screen printing, rotary screen printing, gravure printing, lithographic printing, intaglio printing, digital printing, capillary printing, offset printing, electrohydrodynamic (EHD) printing, microprinting, pad printing, pad printing, stencil printing, wire rod coating, drawing, flexographic printing, stamping, xerography, microcontact printing, dip pen nanolithography, laser printing, via pen or similar means, etc. The ink compositions can be applied in multiple layers. For example the ink may be applied in a single layer, or at least 2, 3, 4, 5, 6, 7, 8, 9, 10, 11, 12, 13, 14, 15, 16, 17, 18, 19 or 20 layers. The number of layers may be dependent on the final application of the ink composition. In one embodiment, the substrate is a micro/nanoparticle mixed into the ink and printed onto another substrate.

After they have been applied to a substrate, the inks and coatings may be cured using any suitable technique, including drying and oven-drying (in air or another inert or reactive atmosphere), UV curing, IR curing, drying, cross-linking, thermal curing, laser curing, IR curing, microwave curing or drying, sintering, and the like.

The cured inks can have a variety of thicknesses. For example, they can optionally have a thickness of at least about 2 nm, or at least about 5 nm. In various embodiments, the coatings can optionally have a thickness of about 2 nm to 2 mm, about 5 nm to 1 mm, about 2 nm to about 100 nm, about 2 nm to about 200 nm, about 2 nm to about 500 nm, about 2 nm to about 1 µm, about 5 nm to about 200 nm, about 5 nm to about 500 nm, about 5 nm to about 1 µm, about 5 nm to about 50 µm, about 5 nm to about 200 µm, about 10 nm to about 200 nm, about 50 nm to about 500 nm, about 50 nm to about 1 µm, about 100 nm to about 10 µm, about 1 µm to about 2 mm, about 1 µm to about 1 mm, about 1 µm to about 500 µm, about 1 µm to about 200 µm, about 1 µm to about 100 µm, about 50 µm to about 1 mm, about 100 µm to about 2 mm, about 100 µm to about 1 mm, about 100 µm to about 750 µm, about 100 µm to about 500 µm, about 500 µm to about 2 mm, or about 500 µm to about 1 mm.

In one embodiment the ink composition is electrically conductive.

In another embodiment the ink composition is thermally conductive.

In some embodiments, the composition (for example, an ink composition when applied to a substrate), can have a resistance in a range of about 10 kΩ to about 20.5 MΩ, for example a resistance of, but not limited to about: 0.5 MΩ to about 20.5 MΩ; less than or equal to about 0.01 MΩ; or less than or equal to about 0.05 MΩ; or less than or equal to about 0.1 MΩ; or less than or equal to about 0.2 MΩ; or less than or equal to about 0.4 MΩ; or less than or equal to about 0.6 MΩ; or less than or equal to about 0.8 MΩ; or less than or equal to about 1 MΩ; or less than or equal to about 2 MΩ; or less than or equal to about 4 MΩ; or less than or equal to about 6 MΩ; or less than or equal to about 8 MΩ; or less than or equal to about 10 MΩ; or less than or equal to about 12 MΩ; or less than or equal to about 14 MΩ; or less than or equal to about 16 MΩ; or less than or equal to about 18 MΩ; or less than or equal to about 20 MΩ.

In some embodiments, the composition (for example, an ink composition when applied to a substrate), may have a thermal conductivity of about 200 to about 470 W/mk. For example a thermal conductivity of, but not limited to: at least about 200 W/mK; or at least about 220 W/mK; or at least about 240 W/mK; or at least about 260 W/mK; or at least about 280 W/mK; or at least about 300 W/mK; or at least about 320 W/mK; or at least about 340 W/mK; or at least about 360 W/mK; or at least about 380 W/mK; or at least about 400 W/mK; or at least about 420 W/mK; or at least about 440 W/mK; or at least about 460 W/mK.

Laser annealing an ink composition as defined herein may electrical improve conductivity.

The compositions, inks and coatings herein may be applied as patterns, letters, logos, or any other shapes which may be imaged, and may be covered by additional materials such as varnishes, fabrics, polymers, etc.

Embodiments of materials of the present invention (e.g., articles such as substrates comprising the inks or coatings as defined herein) may be suitable, for example, for creating printed conductive circuitry that may, for example, be deposited, or may be printed using a variety of modern techniques, such as 3D printing, inkjet printing, selective laser sintering (SLS), fused deposition modelling (FDM) and other methods. For example, complete conductive circuits/pathways may be imbedded into insulating frame or casing and may be printed in one continuous process, easing dramatically the production and assembly of the final product. These printed conductive pathways may be used to create integrated electrical circuitry (e.g., as printed circuit boards), heat sinks, ion batteries, (super)capacitors, antennae (e.g., RFID tags), electromagnetic interference shielding, sensors, electromagnetic radiation shields, solar cell grid collectors, electrostatic shields, or any other application where conductors of electrical current are used.

Methods of Synthesis

Disclosed herein are methods for the synthesis of complexes of carboranes and metallacarboranes with graphene, and compositions comprising such complexes.

Herein graphene may be prepared by any method known in the art, including the solvothermal method disclosed in Choucair, M.; Thordarson, P.; Stride, J. A. *Nature Nanotechnology* 2009, 4, 30. The details of this article are incorporated by reference.

Graphene sheets may be made using any suitable method. For example, they may be obtained from graphite, graphite oxide, expandable graphite, expanded graphite, etc. They may be obtained by the physical exfoliation of graphite, by for example, peeling, grinding, or milling off graphene sheets. They may be made from inorganic precursors, such as silicon carbide. They may be made by chemical vapour deposition (such as by reacting a methane and hydrogen on a metal surface). They may be may by the reduction of an alcohol, such ethanol, with a metal (such as an alkali metal like sodium) and the subsequent pyrolysis of the alkoxide product (such a method is reported in *Nature Nanotechnology* (2009), 4, 30-33, the details of which are incorporated herein via reference). They may be made by the exfoliation of graphite in dispersions or exfoliation of graphite oxide in dispersions and the subsequently reducing the exfoliated graphite oxide.

Reduction of graphite oxide to graphene may be by means of chemical reduction and may be carried out on graphite oxide in a dry form, in a dispersion, etc. Examples of useful chemical reducing agents include, but are not limited to, hydrazine, sodium borohydride, citric acid, hydroquinone, phenyl isocyanate, hydrogen, hydrogen plasma, etc. A dispersion or suspension of exfoliated graphite oxide in a carrier (such as water, organic solvents, or a mixture of solvents) can be made using any suitable method (such as ultrasonication and/or mechanical grinding or milling) and reduced to graphene sheets.

One example of a method for the preparation of graphene sheets is to oxidise graphite to graphite oxide, which is then thermally exfoliated to form graphene sheets (also known as thermally exfoliated graphite oxide), as described in US 2007/0092432, the disclosure of which is hereby incorporated herein by reference.

Graphene sheets may be annealed or reduced to graphene sheets having higher carbon to oxygen ratios by heating under reducing atmospheric conditions (e.g., in systems purged with inert gases or hydrogen).

The time of heating can be for example, at least about 1 second, or at least about 10 seconds, or at least about 1 minute, or at least about 2 minutes, or at least about 5 minutes. In some embodiments, the heating time may be, but is not limited to: at least about 15 minutes; or at least about 30 minutes; or at least about 45 minutes; or at least about 60 minutes; or at least about 90 minutes; or at least about 120 minutes; or at least about 150 minutes. During the course of annealing/reduction, the temperature may vary within these ranges. The temperature may be greater than about 200° C. The heating may take place under vacuum, for example a vacuum of at least about 10 mbar.

The heating may be done under a variety of conditions, including in an inert atmosphere (such as argon or nitrogen) or a reducing atmosphere, such as hydrogen (including hydrogen diluted in an inert gas such as argon or nitrogen), or under vacuum.

According to a further aspect, the present invention provides a process for producing a complex comprising one or more metallacarboranes bound to a graphene. The process comprises the steps of:

i) reacting a graphene with a carborane in a dehydrogenation and/or deboronation reaction to obtain a graphene covalently bound with one or more carboranes;
ii) isolating graphene-bound carborane of step i); and
iii) contacting the material of step ii) with a strong base and a metal halide.

The process of the present invention allows for a metallacarborane to be accessed from the corresponding carborane by a single step, i.e. in the presence of a strong base and a metal halide.

According to another aspect, the present invention provides a further process for producing a complex comprising one or more metallacarboranes bound to a graphene. This further process comprises the steps of:
i) reacting a graphene with a carborane in a dehydrogenation and/or deboronation reaction to obtain a graphene covalently bound with one or more carboranes;
ii) isolating graphene-bound carborane of step i);
iii) reacting the material of step ii) with caesium fluoride;
iv) isolating the graphene-carborane complex of step iii); and
v) reacting the isolated material of step iv) in a deboronation reaction with a metal halide.

In some embodiments, the dehydrogenation and/or deboronation reactions described herein are performed in the presence of a butyllithium. In an embodiment, the butyllithium is n-butyllithium. The steps of the processes described herein may be performed in the presence of a suitable solvent. For example, a suitable solvent may be tetrahydrofuran (THF).

In some embodiments, the strong base is a hydroxide base. For example, the hydroxide base is sodium hydroxide or potassium hydroxide.

The complexes described herein may be formed by blending graphene sheets comprising at least one carborane or metallacarborane with at least one solvent and one or more optional components as described herein. The compositions comprising a complex as described herein may be made using any suitable method, including wet or dry methods and batch, semi-continuous, and continuous methods. Dispersions, suspensions, solutions, etc. of functionalised graphene sheets and one or more aliphatic compounds (including inks and coatings formulations) can be made or processed (e.g., milled/ground, blended, dispersed, suspended, etc.) by using suitable mixing, dispersing, and/or compounding techniques. For example, components of the ink compositions, such as one or more of the graphene sheets, functionalised graphene sheets comprising at least one carborane, and/or other optional components may be processed (e.g., milled/ground, blended, etc. by using suitable mixing, dispersing, and/or compounding techniques and apparatus, including ultrasonic devices, high-shear mixers, ball mills, attrition equipment, sandmills, two-roll mills, three-roll mills, cryogenic grinding crushers, extruders, kneaders, double planetary mixers, triple planetary mixers, high pressure homogenizers, horizontal and vertical wet grinding mills, etc.). Processing (including grinding) technologies can be wet or dry and can be continuous or discontinuous. Suitable materials for use as grinding media include metals, carbon steel, stainless steel, ceramics, stabilized ceramic media (such as cerium yttrium stabilized zirconium oxide), PTFE, glass, tungsten carbide, etc. Methods such as these can be used to change the particle size and/or morphology of the functionalised graphene sheets comprising at least one carborane or metallacarborane, other components, and blends or two or more components.

Components may be processed together or separately and may go through multiple processing (including mixing/blending) stages, each involving one or more components (including blends).

There is no particular limitation to the way in which the functionalised graphene sheets comprising at least one carborane or metallacarborane, and other components are processed and combined. For example, the functionalised graphene sheets comprising at least one carborane or metallacarborane may be processed into given particle size distributions and/or morphologies separately and then combined for further processing with or without the presence of additional components. Unprocessed graphene sheets and/or graphite may be combined with processed graphene sheets and/or graphite and further processed with or without the presence of additional components. Processed and/or unprocessed graphene sheets and/or processed and/or unprocessed graphite may be combined with other components, and then combined with processed and/or unprocessed graphene sheets and/or processed and/or unprocessed graphite. Two or more combinations of processed and/or unprocessed graphene sheets and/or processed and/or unprocessed graphite that have been combined with other components may be further combined or processed.

After any blending and/or grinding steps, additional components may be added to the ink compositions, including, but not limited to, thickeners, viscosity modifiers, binders, etc. The compositions may also be diluted by the addition of more carrier.

Methods of printing the ink compositions and coatings as described herein are known to those skilled in the art. For example the methods disclosed in S. R. Das et al., *Nanoscale*, 8, 15870-15879, 2016. The content of this article are incorporated by reference.

Graphene materials with variations in morphology, defect density, accessible surface area, electronic and magnetic properties, and oxygen content may be prepared.

The carboranes disclosed herein may be synthesised by any method known in the art. For example: the methods disclosed in: K. P. Callahan et al., *Pure and Applied Chemistry*, 39(4), 475-495; V. I. Begadze, *Chem. Rev.*, 92(2), 209-223, 1992; and Bohumil Stiber, *Chem. Rev.*, 92(2), 225-250, 1992, the contents of which are incorporated by reference.

In one embodiment, one or more hydrogen atoms on a carborane may be acidic. These hydrogen atoms may undergo a reaction with organolithium reagents (such as butyllithium) to produce C-lithiated carboranes. The formation of a carboryne (for example a lithio-carboryne), may be utilised for attaching the carborane to graphene. As carboranyl carbon lithium bonds are susceptible to electrophilic attack, substituted meta- and para-carboranes can potentially be prepared. Alternatively, carboranyl Grignard agents and copper derivatives may be prepared and used in a similar manner to the lithium compounds, or equivalent species.

Both 1,2- and 1,7-$B_{10}C_2H_{12}$ can be degraded by strong bases to give isomeric $B_9C_2H_{11}$ ions. This removal of a $BH^{2+}$ unit from the parent carborane can be considered to result from nucleophilic attack at the most electron-deficient boron atom of the carborane. The $B_9C_2H_{11}$ ions can be protonated to form the neutral nido-carborane, $B_9C_2H_{13}$, which is a strong acid.

Herein the method comprises a step of chemically attaching carborane cage molecules to the surface of graphene. The method may also comprise the step of converting the carborane in to a metallacarborane.

The carboranes disclosed herein, may be converted into a corresponding metallacarborane by any method known in the art. For example the methods disclosed in Hawthorne, M. F. *Journal of Organometallic Chemistry* 1975, 100, 97 or Saxena, A. K.; Hosmane, N. S. *Chemical Reviews* 1993, 93, 1081; or Singh, A. K.; Sadrzadeh, A.; Yakobson, B. I. *Journal of the American Chemical Society* 2010, 132, 14126. The contents of these documents are incorporated by reference.

Herein the formation of metal oxides may be minimised or avoided by undertaking one or more steps under dry and inert conditions, for example by using a nitrogen or argon atmosphere for one or more synthetic steps.

In one embodiment the method requires the conversion of a closo-carborane in to a corresponding nido-carborane, for example a 7,8-nido-carborane anion covalently bound to the graphene surface. The nido-carborane may then be converted in to a metallacarborane.

The preparation of metallacarboranes may require the generation of a nido-carborane, for example a 7,8-nido-carborane anion, followed by subsequent deprotonation and reaction with a desired metal salt. Appropriate metal salts include, but are not limited to metal halides.

In another embodiment, metallacarboranes may also be generated in a single step without the need to isolate the nido-carborane anion. For example, by boiling graphene-bound icosahedral carborane clusters with cyclopentadiene ($C_5H_6$) and the corresponding metal halide in strong alcoholic bases (for example, NaOH in ethanol). Exemplary examples for synthesising graphene and metallacarborane compositions are shown in FIG. 1.

When applied to a substrate, the compositions, inks and coatings can have a variety of forms. They can be present as a film or lines, patterns, letters, numbers, circuitry, logos, identification tags, and other shapes and forms. The inks and coatings may be covered in whole or in part with additional material, such as overcoatings, varnishes, polymers, fabrics, etc.

The compositions, inks and coatings can be applied to the same substrate in varying thicknesses at different points and can be used to build up three-dimensional structures on the substrate.

The compositions, inks and coatings can be used to make printed electronic devices (also referred to as "printed electronics"), which may be in the form of complete devices, parts or sub elements of devices, electronic components, etc, or in the development of a sensor, for example as part of a component for a sensor.

Printed electronics may be prepared by applying the inks and coatings to the substrate in a pattern comprising an electrically conductive pathway designed to achieve the desired electronic device. The pathway may be solid, mostly solid, in a liquid or gel form, etc.

The printed electronic devices may take on a wide variety of forms and be used in a large array of applications. They may contain multiple layers of electronic components (e.g., circuits) and/or substrates. All or part of the printed layer(s) may be covered or coated with another material such as a cover coat, varnish, cover layer, cover films, dielectric coatings, electrolytes and other electrically conductive materials, etc. There may also be one or more materials between the substrate and printed circuits. Layers may include semiconductors, metal foils, dielectric materials, etc.

According to another embodiment, the present invention provides an electronic device comprising a surface on which a complex according to the present invention or a composition there of is printed. The complex or composition thereof containing a carborane or metallacarborane bound to a graphene may be electrically conductive such that the printed complex or composition thereof is capable of conducting an electrical signal. The electronic device described herein may be capable of conducting an electrical signal by means of the printed complex or composition comprising a carborane or metallacarborane bound to a graphene. The present inventors have found that the complexes described herein are capable of being printed as a single component, owing to physical characteristics of the complexes that allow for the stability and dispersion properties required for such printing.

The materials and compositions described herein may be characterised by any appropriate methods known in the art. Possible methods of characterisation include, but are not limited to: X-ray photoelectron spectroscopy, $^{11}$B and $^{13}$C solid-state nuclear magnetic resonance, gas sorption analysis, atomic force microscopy (AFM), transmission electron microscopy (TEM), infra-red and Raman spectroscopy, X-ray diffraction, thermogravimetric analysis, chronoamperometry, electrical impedence spectroscopy, cyclic voltammetry, differential pulse voltammetry, and mixtures thereof.

$^{13}$C and $^2$H labelled synthetic graphene may be synthesised using isotopically enriched precursors. The materials may be characterised using solid-state nuclear magnetic resonance (NMR). Quantitative $^{13}$C NMR measurements could be used to evaluate the fraction and nature of defect sites and functional groups, and to measure heteronuclear distances to precisely determine crystal domain sizes. Structural regularity of the aromatic species could be measured by the chemical shift anisotropies in the materials. In addition, $^{13}$C-$^{13}$C through space experiments could potentially measure the degree of curvature in the carbon materials. $^2$H wide-line NMR may be utilised to measure the dynamics of hydrogen bound at specific edge and defect sites. The fractional evaluation of protonated edge sites within the materials could also be obtained. Two-dimensional $^{13}$C-$^{13}$C correlation techniques (e.g., incredible natural-abundance double-quantum transfer experiments) could be used to establish the connectivity between the different functional sites in the materials. In one embodiment, isotopic carbon enrichment could reduce experimental acquisition time, for example by nearly six orders of magnitude.

Electron spin resonance may be used for characterising the compositions and materials disclosed herein. The spin dynamics of conducting carbon materials may be studied using multi-frequency (1-420 GHz) continuous wave and pulsed ESR. Specific signature parameters of various electron systems within the materials disclosed herein may be obtained. The g-factor, ESR line-width and line-shape, and spin relaxation times, could possibly be used to quantitatively determine the distances between electron spins and the number of electron spins in the carbon materials. From the $^{13}$C concentration dependence of the ESR linewidth, the residual linewidth contributions originating from grain boundaries and from $^1$H inclusion may also be determined.

Biosensors

Disclosed herein is a biosensor which comprises one or more ink compositions as described herein. Herein, a biosensor may be regarded as an analytical device which converts a biological response into a quantifiable and processable signal. An overview of electrochemical biosensors may be found in D. Grieshaber et al, *Sensors (Basel)*, 8(3), 1400-1458, 2008, the contents of which are incorporated by reference. Currently, there are few materials that allow for highly sensitive and selective and portable biosensing. Current materials such as silicon may show bioincompatibilities, while other optically active materials do not allow for the required portability.

The biosensor described herein may be used to analyse one or more samples. The sample may be a material that needs to be analysed, for example a sample that needs to be tested for the presence of a small molecule or a biomolecule such as a protein.

The biosensor may be in the form of a "biosensor device". Herein the biosensor device may be a manufactured machine that employs a biosensor as described herein. In one embodiment the device has an inlet port or a sample receptacle, which may permit the entry of a liquid or solid sample. Alternatively, the device may be provided with one or more binding molecules already reversibly or irreversibly bound to a composition as described herein, ready to receive a sample.

Performance of an analytical test using a biosensor as defined herein may involve control not only of temperature, but also pH, redox potential, salt concentration, and any other variables. Depending on the system involved, the nature of the sample, and the type of analyte, one or more of these factors can disrupt an analysis. Herein the one or more of these factors may be optimised to achieve desirable analysis sensitivity, selectivity and specificity. The general performance of electrochemical sensors may be determined by the surface architectures that connect the sensing element to the biological sample at the nanometre scale.

Herein, the biosensor may comprise two components: a bioreceptor and biotransducer. The bioreceptor may be immobilised on a working electrode and changes in chemistry at the interface complete the biotransduction. The uniqueness of a biosensor is that the two components are integrated into one sensor. Herein, a composition as described in the form of an ink may be printed into or on to an electrode, and contains the hierarchal chemistry to contain the bioreceptors as constituents. An analyte may be introduced, where the analyte, a bioreceptor and the (metalla)carborane-graphene complex can interact.

In one embodiment the biosensor is an electrochemical biosensor, wherein there may be a direct conversion of a biological event to an electronic signal. This may provide a cost effective and simple strategy, using nanostructured electrodes, to improve sensitivity, selectivity, versatility, biocompatibility and portability.

The electrochemical biosensor can comprise a reference electrode, a counter electrode, and sensing electrode. Cyclic voltammetry, chronoamperometry, chronopotentiometry and impedance spectroscopy can be used for characterising the final products following the application of an ink composition to an appropriate substrate. Additional measurement techniques may be used in combination with electrochemical detection, i.e. multiplexing, such as the electrochemical versions of surface plasmon resonance, spectroscopy, and scanning probe microscopy.

The biosensor may be used for multiplexing. Alternatively the biosensor may be used for selective sensing. For example, electrochemical enzymatic biosensors may be built up similar to the enzyme-linked immunosorbent assay (ELISA). After immobilizing antibodies to a surface, an analyte could be introduced to which the antibodies bind specifically. In the most common detection scheme a secondary labelled antibody then binds to the analyte in order to detect its concentration. The detection antibodies are coupled to an enzyme, which allows quantitative measurements of the amount of bound antigens by monitoring the electrical signal generated by an enzymatic reaction.

In one embodiment the biosensor may be used to detect one or more biologically relevant molecules, for example metal binding proteins.

In another embodiment the biosensor may be used to map one or more proteins, for example using spectroscopy.

Examples of small molecules and biomolecules that may be detected or mapped include, but are not limited to phenols, aromatic amines, thioaminosoles, iodide, $H_2O_2$, $O_2$, $CO_2$, enzymes (glucose oxidase, horseradish peroxidase etc.), antibodies, nucleic acids, cells, tissue, whole organisms, etc.

Examples

The present disclosure is now described further in the following non-limiting examples.

Disclosed herein are printed electrodes with resistance of 300-400Ω, which can be sufficient for biosensing device applications.

Cyclic voltametric experiments confirmed the capability of printed electrodes to be used as electrochemical biosensing devices and a resistance of 0.5Ω to 1 MΩ was obtained for an electrode device comprising an ink composition comprising a carborane and graphene. The results showing that the ink compositions may be used for the detection of molecules based on electrostatic/π-π bonding. Phenol molecules can be used to show the capability for graphene detection Impedance detection was used, using an IDA electrode, and with graphene particles dispersed on electrodes as a sensing platform, wherein the analyte "substrate" phenol (0.05-0.5M) was detected.

Protocols

Chemical Synthesis of Graphene

Natural graphite was used as a feedstock material for the synthesis. The graphite was subject to shear mixing (3 hours, 9000 rpm) in a mixture of ethanol and acetone to give a particle with lateral size less than 10 μm as shown in K. R. Paton, et al., *Nature Materials*, 13, 624, 2014, the content of which is incorporated by reference. After drying in a convection oven for 3 hours (80° C.), ball milling was performed (20 to 30 hours, 500 to 1000 rpm) to reduce the lateral particle size to less than 5 μm with possible edge-carboxylated groups as in I.-Y. Jeon, et al., *Proceedings of the National Academy of Sciences*, 109, 5588-5593, 2012, the content of which is incorporated by reference.

The ball-milled material was dispersed in ethanol and then sonicated (UIP1000hd, Hielscher) with a sonotrode diameter of 22 mm, power of 80 W, and an amplitude of 80% for 3 hours at a temperature kept less than 40° C. The material was collected by centrifugation (4200 rpm, 2 hours) and dried in a dynamic vacuum oven.

Chemical Synthesis of Graphene Oxide

Graphite obtained from Archer Exploration Limited Campoona Graphite was used as a feedstock material for the synthesis. A modified Hummer's method is used to synthesise the graphene oxide (GO) sheets directly from the graphite flakes as in D. N. Tran, et al., *Carbon*, 76, 193-202, 2014, the content of which is incorporated by reference.

A mixture of sulphuric acid/phosphoric acid ($H_2SO_4$/$H_3PO_4$) (360:40 mL) was added to a mixture of graphite and potassium permanganate (Graphite/$KMnO_4$) (3:18 ratio by weight) and stirred at 50° C. for 12 hours. The mixture was cooled to 25° C. and poured onto ice with hydrogen peroxide ($H_2O_2$) (3 mL). The resultant yellow-brown material was centrifuged at 4600 g for 2 hours after which the supernatant was removed. The material was then washed in succession with 200 mL of 30% hydrochloric acid (HCl) and twice with 200 mL of ethanol. The precipitates of successive washes were then vacuum dried for 12 hours at 25° C. to obtain a brown coloured product that remained suspended in a gel-like matrix.

Chemical Synthesis of Carborane-Graphene

Preparation of 1,2-closo-$[C_2B_{10}H_{10}]$-Graphene (Doubly Bound) (Compound 1)

Graphene (42 mg) was weighed into a Schlenk tube (50 mL) with stir bar and dried under vacuum at 120° C. overnight. After cooling, anhydrous diethyl ether (4.5 mL) was added and the mixture subjected to ultra-sonication for 30 min. Separately, to an oven-dried round bottom flask equipped with stir bar was added o-carborane (274 mg, 1.90 mmol) and placed under a nitrogen blanket. Anhydrous diethyl ether (4.5 mL) was added to dissolve the o-carborane, with stirring under nitrogen. The solution was cooled to 0° C. on ice and a solution of n-butyl lithium (2.6 mL, 1.6M in hexanes) was added dropwise. The mixture was allowed to warm to ambient temperature and stirred for 35 min before cooling again to 0° C. Bromine (0.1 mL, 310 mg, 1.95 mmol) was added dropwise with vigorous stirring and the reaction allowed to stir for 15 min at 0° C. The carboryne solution was transferred via dry syringe into the sonicated graphene dispersion, stirred at 0° C. Any carboryne residue was rinsed with additional diethyl ether (2 mL) and also transferred to the graphene flask. The mixture was treated by ultra-sonication for 2 hours before heating at reflux overnight (18 hours). After cooling, the reaction was quenched by addition of 1 M HCl (5.5 mL) with stirring. The solid material (i.e. Compound 1) was collected by vacuum filtration onto a glass frit and washed with methanol (10 mL), toluene (5 mL) and water (5 mL). The solid was rinsed off into a glass vial with methanol and the solvent evaporated under a stream of nitrogen overnight before drying under vacuum at 40° C.

Preparation of 1,2-closo-$[C_2B_{10}H_{11}]$-Graphene (Singly Bound) (Compound 2)

Graphene (48.7 mg) was weighed into a Schlenk tube (50 mL) with stir bar and dried under vacuum at 120° C. overnight. After cooling, anhydrous THF (6 mL) was added and the mixture subjected to ultra-sonication for 30 min. Separately, o-carborane (74 mg, 0.51 mmol) was weighed into a dry 2-neck round-bottom flask (25 mL) equipped with septum and stir bar and placed under a nitrogen blanket. The o-carborane was dissolved in anhydrous THF (3 mL) with stirring and the solution cooled to 0° C. on ice. A solution of n-butyl lithium (0.34 mL, 0.54 mmol, 1.6M in hexanes) was added dropwise followed by warming to ambient temperature and stirring for 1 hour. The lithiocarborane solution was transferred via syringe into the sonicated graphene dispersion stirred at ambient temperature. Any lithiocarborane residue was rinsed out with additional THF (2 mL) and also added to the graphene flask. The mixture was treated by ultra-sonication for 3 hours. The reactants were then quenched by addition of 0.1 M HCl (1 mL) with stirring and the solid material collected by vacuum filtration onto a glass frit. The solid was washed with methanol (10 mL), toluene (5 mL) and water (5 mL) before being rinsed off into a glass vial with methanol and the solvent evaporated under a stream of nitrogen overnight. The solid was then dried under vacuum at ambient temperature.

Preparation of 7,8-nido-$Cs[C_2B_9H_{11}]$-Graphene (Singly Bound) (Compound 3)

Solid 1,2-closo-$[C_2B_{10}H_{11}]$-graphene (11.5 mg) and caesium fluoride, CsF (4.35 mg, 28.6 µmol) were weighed into a round bottom flask (25 mL) with stir bar under a nitrogen blanket. Anhydrous ethanol (5 mL) was added. The suspension was heated under reflux with stirring overnight under an inert atmosphere. After cooling to ambient temperature the solid material was collected by vacuum filtration, washing with ethanol (5 mL), methanol (10 mL) and water (5 mL). After air-drying, the solid (i.e. Compound 3) was dried under vacuum at room temperature overnight Preparation of $C_5H_5Zn[C_2B_9H_{10}]$-Graphene (Doubly Bound) (Compound 4)

Compound 1 (16 mg) was placed into a two-neck round bottom flask (25 mL) with stir bar and placed under a nitrogen blanket. Anhydrous ethanol (5 mL) was added and the mixture subjected to ultra-sonication for 30 min to disperse the material. The dispersion was cooled to 0° C. on ice and solid potassium hydroxide (56.1 mg, 1.00 mmol) added with stirring. The solution was then heated to reflux for 30 min to ensure complete deprotonation, then cooled to 0° C. on ice. Freshly distilled cyclopentadiene (0.255 mL, 20 mg, 0.30 mmol) was transferred to the flask under nitrogen and the mixture stirred for 15 min, followed by addition of anhydrous zinc (II) chloride (42 mg, 0.31 mmol) as a solid in one portion. The mixture was subjected to ultra-sonication for 1 hour followed by heating at reflux overnight (18 hours). After cooling, the mixture was diluted with ethanol and the solids collected by vacuum filtration, washing with ethanol (3×8 mL). The black solid was further washed with water (4×5 mL). The solid was rinsed off into a glass vial with ethanol and the solvent evaporated under a stream of nitrogen overnight. The material was dried under vacuum at ambient temperature for 20 hours.

Preparation of $C_5H_5Zn[C_2B_9H_{10}]$-Graphene (Singly Bound) (Compound 5)

To single-neck round bottom flask (25 mL) with stir bar was added Compound 3 (4.75 mg) and the material dried under vacuum at ambient temperature overnight. The flask was placed under a nitrogen blanket and anhydrous THF (5 mL) added followed by ultra-sonication treatment for 30 min to disperse material. The dispersion was cooled to 0° C. on ice and a solution of n-BuLi (1.6 M in hexanes, 0.1 mL, 0.16 mmol) added dropwise. The mixture was stirred at 0° C. for 15 min then allowed to warm to ambient temperature. Freshly distilled cyclopentadiene (0.255 mL, 20 mg, 0.30 mmol) was transferred to the flask under nitrogen followed by stirring for 15 min. Anhydrous zinc (II) chloride (42 mg, 0.31 mmol) was then added as a solid in one portion. The resulting mixture was subjected to ultra-sonication for 1 hour and heated at reflux overnight (18 hours). The reaction was allowed to cool to ambient temperature and all volatiles removed at reduced pressure. Ethanol was added to the resulting black residue and the solid collected by vacuum filtration onto a glass frit, washing with ethanol (3×8 mL). The black solid was further washed with water (4×5 mL). The solid was rinsed off into a glass vial with ethanol and the solvent evaporated under a stream of nitrogen overnight. The material was dried under vacuum at ambient temperature for 20 hours.

Preparation of $\eta^5$-$C_5H_5Mn[C_2B_9H_{10}]$-Graphene (Doubly Bound) (Compound 6)

Dried Compound 1 (10 mg) was loaded into a two-neck round bottom flask (25 mL) with stir bar and placed under a nitrogen blanket. Anhydrous ethanol (5 mL) was added and the mixture briefly subjected to ultra-sonication to disperse material. The dispersion was cooled to 0° C. on ice and solid potassium hydroxide (70 mg, 1.25 mmol) added with stirring. The mixture was heated at reflux for 1 hour to ensure complete deprotonation, then cooled to 0° C. on ice. Anhydrous manganese (II) chloride (39 mg, 0.31 mmol) was then added as a solid in one portion. The dispersion was again subjected to ultra-sonication for 30 min. Freshly distilled cyclopentadiene (0.51 mL, 20 mg, 0.60 mmol) was transferred to the reaction vessel under nitrogen the mixture treated by ultra-sonication for 1 hour followed by heating at reflux overnight (18 hours). After cooling, the mixture was diluted with ethanol and the solids collected by vacuum filtration, washing with ethanol (3×8 mL). The black solid was further washed with water (4×5 mL). The solid was rinsed off into a glass vial with ethanol and the solvent evaporated under a stream of nitrogen overnight. The material was dried under vacuum at ambient temperature for 20 hours.

Preparation of $\eta^5$-$C_5H_5Mn[C_2B_9H_{11}]$-Graphene (Singly Bound) (Compound 7)

Dried Compound 3 (5 mg) was weighed into single-neck round bottom flask (25 mL) with stir bar and placed under a nitrogen blanket. Anhydrous THF (3 mL) was added and the mixture treated by ultra-sonication for 30 min to disperse the material. The dispersion was cooled to 0° C. on ice and a solution of n-BuLi (1.6 M in hexanes, 0.1 mL, 0.16 mmol) added. The mixture was stirred at 0° C. for 15 minutes then allowed to warm to room temperature. In a separate flask was added distilled cyclopentadiene (0.51 mL, 40 mg, 0.60 mmol) and anhydrous THF (1 mL) which was cooled to 0° C. on ice. A solution of n-BuLi (1.6 M in hexanes, 0.375 mL, 0.60 mmol) was added to the cyclopentadiene solution dropwise with stirring. The freshly prepared lithium cyclopentadienide solution was transferred under nitrogen into graphene flask at 0° C. The mixture was then subjected to ultra-sonication for 30 min followed by addition of anhydrous manganese (II) chloride (39 mg, 0.31 mmol) as a solid in one portion. The reaction was treated by ultra-sonication for 1 hour followed by heating at reflux overnight (18 hours). The reaction was allowed to cool to ambient temperature and volatiles removed at reduced pressure. The residue was redispersed in ethanol (6 mL) and the solid collected by vacuum filtration, washing with ethanol (3×8 mL). The solid was further washed with water (3×5 mL), rinsed off into a glass vial with ethanol and the solvent evaporated under a stream of nitrogen overnight. Finally the material was dried under vacuum at room temperature.

Preparation of $\eta^5$-$C_5H_5Gd[C_2B_9H_{10}]$-Graphene (Doubly Bound) (Compound 8)

Dried Compound 1 (10 mg) was loaded into two-neck round bottom flask (25 mL) with stir bar and placed under a nitrogen blanket. Anhydrous ethanol (5 mL) was added and the mixture briefly subjected to ultra-sonication to disperse material. The dispersion was cooled to 0° C. on ice and solid sodium hydroxide (100 mg, 1.50 mmol) added with stirring. The mixture was heated at reflux for 1 hour to ensure complete deprotonation, then cooled to 0° C. on ice. Anhydrous gadolinium (III) chloride (82 mg, 0.31 mmol) was then added as a solid in one portion. The dispersion was again subjected to ultra-sonication for 30 min and cooled to 0° C. on ice. To the reaction was added a solution of sodium cyclopentadienide (0.24 mL, 0.60 mmol, 2.5 M in THF) under nitrogen and the mixture treated by ultra-sonication for 1 hour followed by heating at reflux overnight (18 hours). After cooling, the mixture was diluted with ethanol and the solids collected by vacuum filtration, washing with ethanol (3×8 mL). The black solid was further washed with water (4×5 mL). After air-drying, the material was dried under vacuum at ambient temperature for 20 hours.

Preparation of $\eta^5$-$C_5H_5Gd[C_2B_9H_{11}]$-Graphene (Singly Bound) (Compound 9)

Solid 7,8-nido-Cs[$C_2B_9H_{11}$]-graphene (5 mg) was loaded into single-neck round bottom flask (25 mL) with stir bar and placed under a nitrogen blanket. Anhydrous THF (3 mL) was added and the mixture briefly subjected to ultra-sonication to disperse the material. The dispersion was cooled to 0° C. on ice and a solution of sodium tert-butoxide (30 mg, 0.31 mmol) in anhydrous THF (1 mL) added dropwise under nitrogen. The reaction was allowed to stir at 0° C. for 15 minutes then allowed to warm and stirred at room temperature for 2 h. The dispersion was again cooled to 0° C. and solid gadolinium (III) chloride (61 mg, 0.24 mmol) added in one portion. After treatment by ultra-sonication for 30 min at room temperature, the reaction was cooled to 0° C. on ice and a solution of sodium cyclopentadienide (0.06 mL, 2.5 M in THF) added dropwise under nitrogen. The reactants were thoroughly dispersed by subjection to ultra-sonication for 1 hour followed by stirring at ambient temperature overnight (18 hours). The reactants were quenched by addition of methanol (5 mL) and the solid was collected by vacuum filtration, washing with ethanol (4×5 mL). The solid was further washed with water (4×10 mL) until the washings were approximately pH 7 (neutral). The material was further washed with ethanol (2×5 mL), toluene (6 mL) and diethyl ether (6 mL). After air-drying, the material was dried under vacuum at ambient temperature for 24 hours.

Preparation of $\eta^5$-$C_5H_5Ni[C_2B_9H_{10}]$-Graphene (Doubly Bound) (Compound 10)

Dried Compound 1 (10 mg) was loaded into two-neck round bottom flask (25 mL) with stir bar and placed under a nitrogen blanket. Anhydrous ethanol (5 mL) was added and the mixture briefly subjected to ultra-sonication to disperse material. The dispersion was cooled to 0° C. on ice and solid potassium hydroxide (100 mg, 1.79 mmol) added with stirring. The mixture was heated at reflux for 1 hour to ensure complete deprotonation, then cooled to 0° C. on ice. Solid nickel (II) chloride hexahydrate (74 mg, 0.31 mmol) was then added in one portion. The dispersion was again subjected to ultra-sonication for 30 min. Freshly distilled cyclopentadiene (0.51 mL, 20 mg, 0.60 mmol) was transferred to the reaction vessel under nitrogen the mixture treated by ultra-sonication for 1 hour followed by heating at reflux overnight (18 hours). After cooling, the mixture was diluted with ethanol and the solids collected by vacuum filtration, washing with ethanol (3×8 mL). The black solid was further washed with water (4×5 mL), ethanol (2×5 mL), toluene (6 mL) and diethyl ether (6 mL). After air-drying, the material was dried under vacuum at ambient temperature for 20 hours.

Preparation of $\eta^5$-$C_5H_5Ni[C_2B_9H_{11}]$-Graphene (Singly Bound) (Compound 11)

Solid Compound 3 (5 mg) was loaded into single-neck round bottom flask (25 mL) with stir bar and placed under a nitrogen blanket. Anhydrous THF (3 mL) was added and the mixture briefly subjected to ultra-sonication to disperse the material. The dispersion was cooled to 0° C. on ice and a solution of sodium tert-butoxide (30 mg, 0.31 mmol) in anhydrous THF (1 mL) added dropwise under nitrogen. The reaction was allowed to stir at 0° C. for 15 minutes then allowed to warm and stirred at room temperature for 2 h. The dispersion was again cooled to 0° C. and solid nickel (II) bis(acetylacetonate) (80 mg, 0.31 mmol) added in one portion. After treatment by ultra-sonication for 30 min at room temperature, the reaction was cooled to 0° C. on ice and a solution of sodium cyclopentadienide (0.06 mL, 2.5 M in THF) added dropwise under nitrogen. The reactants were thoroughly dispersed by subjection to ultra-sonication for 1 hour followed by stirring at ambient temperature overnight (18 hours). The reactants were quenched by addition of methanol (5 mL) and the solid was collected by vacuum filtration, washing with ethanol (4×5 mL). The solid was further washed with water (4×10 mL) until the washings were approximately pH 7 (neutral). The material was further washed with ethanol (2×5 mL), toluene (6 mL) and diethyl ether (6 mL). After air-drying, the material was dried under vacuum at ambient temperature for 20 hours.

Preparation of $\eta^5$-$C_5H_5Fe[C_2B_9H_{10}]$-Graphene (Doubly Bound) (Compound 12)

Dried Compound 1 (10 mg) was loaded into two-neck round bottom flask (25 mL) with stir bar and placed under a nitrogen blanket. Anhydrous ethanol (5 mL) was added and the mixture briefly subjected to ultra-sonication to disperse material. The dispersion was cooled to 0° C. on ice and solid potassium hydroxide (90 mg, 1.60 mmol) added with stirring. The mixture was heated at reflux for 1 hour to ensure complete deprotonation, then cooled to 0° C. on ice. Anhydrous iron (II) chloride (24 mg, 0.19 mmol) was then added as a solid in one portion. The dispersion was again subjected to ultra-sonication for 30 min. Freshly distilled cyclopentadiene (0.125 mL, 4.9 mg, 0.15 mmol) was transferred to the reaction vessel under nitrogen the mixture treated by ultra-sonication for 1 hour followed by heating at reflux overnight (18 hours). After cooling, the mixture was diluted with ethanol and the solids collected by vacuum filtration, washing with ethanol (4×5 mL). The solid was further washed with water (4×10 mL) until the washings were approximately pH 7 (neutral). The material was further washed with ethanol (2×5 mL), toluene (6 mL) and diethyl ether (6 mL). After air-drying, the material was dried under vacuum at ambient temperature for 20 hours.

Characterisation of Metallacarboranes by X-Ray Photoelectron Spectroscopy (XPS)

Analysis of complexes by XPS according to the present invention were performed according to the following parameters:

| | |
|---|---|
| Instrument: | ESCALAB250Xi |
| Manufacturer: | Thermo Scientific, UK |
| Background vacuum: | better than 2E-9 mbar |
| X-ray source: | mono-chromated Al K alpha (energy 1486.68 eV) |
| Power: | 120 W (13.8 kV × 8.7 mA) |
| Spot size: | 500 micrometres |
| Photoelectron take-off angle: | 90 degrees |
| Pass energy: | 100 eV for survey scans, or 20 eV for region scans |
| Software: | Thermo Scientific Avantage |
| Spectrometer calibration: | Au 4f7 = 83.96 eV, Ag 3d5 = 368.21 eV, Cu2p3 = 932.62 eV |
| Binding energy reference: | C 1s = 284.8 eV for adventitious hydrocarbon |

Analysis of Compound 1 by XPS:

TABLE 1

| Name | Peak BE | FWHM eV | Area (P) CPS · eV | Atomic % |
|---|---|---|---|---|
| Flood gun off | | | | |
| C1s A | 284.8 | 1.25 | 24335.34 | 60.52 |
| C1s B | 286.47 | 1.25 | 4451.86 | 11.07 |
| C1s C | 287.8 | 1.25 | 1688.89 | 4.2 |
| C1s D | 289.13 | 1.25 | 1645.9 | 4.09 |
| C1s E | 290.75 | 1.25 | 608.76 | 1.51 |
| O1s A | 533.49 | 1.93 | 9351.7 | 8.32 |
| O1s B | 531.86 | 1.93 | 7084.54 | 6.3 |
| O1s C | 536.24 | 1.93 | 293.3 | 0.26 |
| B1s A | 189.63 | 1.91 | 568.72 | 3.73 |
| Flood gun on | | | | |
| C1s A | 284.8 | 1.25 | 25619.06 | 60.75 |
| C1s B | 286.48 | 1.25 | 4609.07 | 10.93 |
| C1s C | 287.8 | 1.25 | 1651.65 | 3.92 |
| C1s D | 289.15 | 1.25 | 1706.06 | 4.05 |
| C1s E | 290.73 | 1.25 | 565.35 | 1.34 |
| O1s A | 533.5 | 1.93 | 9881.25 | 8.38 |
| O1s B | 531.86 | 1.93 | 7203.12 | 6.11 |
| O1s C | 536.5 | 1.93 | 298.41 | 0.25 |
| B1s A | 189.61 | 1.93 | 650.65 | 4.07 |
| B1s B | 192.15 | 1.93 | 32.32 | 0.2 |

Results of analysis by XPS are listed in Table 2. From the results provided in Table 2, it can be concluded that the graphene surface on which the metallacarboranes are located has undergone a reaction. Furthermore, the results show that the carborane adducts have also undergone a reaction.

TABLE 2

| Name | Peak BE | FWHM eV | Area (P) CPS · eV | Atomic % |
|---|---|---|---|---|
| Compound 2 Flood gun off | | | | |
| C1s A | 284.8 | 1.25 | 27537.22 | 59.02 |
| C1s B | 286.44 | 1.37 | 5479.97 | 11.75 |
| C1s C | 287.8 | 1.37 | 2064.03 | 4.43 |
| C1s D | 289.2 | 1.37 | 1909.06 | 4.09 |
| C1s E | 290.95 | 1.37 | 640.57 | 1.37 |
| O1s A | 533.43 | 1.96 | 10749.14 | 8.24 |
| O1s B | 531.88 | 1.96 | 8318.7 | 6.37 |
| B1s A | 189.56 | 1.87 | 707.63 | 4 |
| N1s A | 400.04 | 1.69 | 289.6 | 0.37 |
| N1s B | 402.05 | 1.68 | 273.32 | 0.35 |
| Compound 2 Flood gun on | | | | |
| C1s A | 284.8 | 1.24 | 27269.6 | 59 |
| C1s B | 286.43 | 1.36 | 5289.29 | 11.45 |
| C1s C | 287.8 | 1.36 | 1944.65 | 4.21 |
| C1s D | 289.19 | 1.36 | 1882.33 | 4.07 |
| C1s E | 290.94 | 1.36 | 627.82 | 1.36 |

TABLE 2-continued

| Name | Peak BE | FWHM eV | Area (P) CPS · eV | Atomic % |
|---|---|---|---|---|
| O1s A | 533.4 | 1.96 | 10575.61 | 8.18 |
| O1s B | 531.89 | 1.96 | 8336 | 6.45 |
| B1s A | 189.59 | 2.01 | 766.05 | 4.37 |
| N1s A | 399.94 | 1.92 | 337.2 | 0.44 |
| N1s B | 402.01 | 1.92 | 356.83 | 0.47 |
| Compound 3 Flood gun off | | | | |
| C1s A | 283.8 | 1.26 | 27253.33 | 58.98 |
| C1s B | 285.45 | 1.26 | 5118.91 | 11.08 |
| C1s C | 286.8 | 1.26 | 2231.94 | 4.83 |
| C1s D | 288.08 | 1.26 | 1814.85 | 3.93 |
| C1s E | 289.55 | 1.26 | 605.4 | 1.31 |
| O1s A | 532.38 | 2.12 | 11819.34 | 9.15 |
| O1s B | 530.66 | 2.12 | 9340.18 | 7.22 |
| Cs3d5 | 724.03 | 1.55 | 16480.36 | 1.3 |
| B1s A | 188.15 | 2.31 | 329.97 | 1.88 |
| B1s B | 191.2 | 2.31 | 55.38 | 0.32 |
| Compound 4 Flood gun off | | | | |
| C1s A | 284.8 | 1.42 | 7894.89 | 20.11 |
| C1s B | 286.31 | 1.42 | 1296.83 | 3.3 |
| C1s C | 287.8 | 1.42 | 237.26 | 0.6 |
| C1s D | 289.51 | 1.42 | 243.74 | 0.62 |
| O1s A | 530.92 | 1.18 | 27467.65 | 25 |
| O1s B | 532.16 | 1.18 | 10492.84 | 9.55 |
| O1s C | 533.17 | 1.18 | 3725.73 | 3.39 |
| Cl2p3 A | 199.82 | 1.93 | 320.57 | 0.46 |
| Zn2p3 | 1021.92 | 1.54 | 257850.35 | 36.96 |
| Compound 4 Flood gun on | | | | |
| C1s A | 284.8 | 1.42 | 7898.36 | 19.74 |
| C1s B | 286.19 | 1.42 | 1574.71 | 3.94 |
| C1s C | 287.8 | 1.42 | 580.77 | 1.45 |
| C1s D | 289.79 | 1.42 | 472 | 1.18 |
| O1s A | 531.02 | 1.19 | 26817.26 | 23.96 |
| O1s B | 532.25 | 1.19 | 10760.64 | 9.62 |
| O1s C | 533.21 | 1.19 | 4111.83 | 3.67 |
| Cl2p3 A | 199.91 | 1.96 | 268.26 | 0.37 |
| Zn2p3 | 1022.14 | 1.54 | 256329.85 | 36.06 |
| Compound 5 Flood gun off | | | | |
| Zn2p3 A | 1022.4 | 1.6 | 3706.36 | 0.47 |
| C1s A | 284.8 | 1.26 | 22741.93 | 51.56 |
| C1s B | 286.51 | 1.26 | 6491.57 | 14.72 |
| C1s C | 288 | 1.26 | 1567.56 | 3.55 |
| C1s D | 288.97 | 1.26 | 724.51 | 1.64 |
| O1s A | 532.26 | 1.41 | 17599.52 | 14.26 |
| O1s B | 533.5 | 1.4 | 9954.98 | 8.07 |
| O1s C | 530.84 | 1.4 | 1454.6 | 1.18 |
| Si2p A | 102.25 | 1.25 | 1589.58 | 3.95 |
| Cs3d5 A | 724.75 | 1.48 | 2342.34 | 0.19 |
| B1s A | 189.04 | 1.73 | 64.76 | 0.39 |
| Compound 5 Flood gun on | | | | |
| C1s A | 284.8 | 1.18 | 22485.87 | 50.71 |
| C1s B | 286.54 | 1.18 | 7028.26 | 15.85 |
| C1s C | 288.07 | 1.18 | 912.74 | 2.06 |
| C1s D | 289.07 | 1.18 | 383.36 | 0.86 |
| O1s A | 532.21 | 1.27 | 15500.14 | 12.5 |
| O1s B | 533.52 | 1.27 | 13925.02 | 11.23 |
| O1s C | 530.91 | 1.27 | 1485.85 | 1.2 |
| Si2p A | 102.21 | 1.18 | 1681.53 | 4.16 |
| Si2p B | 103.44 | 1.18 | 245.64 | 0.61 |
| Zn2p3 | 1022.43 | 1.48 | 2921.47 | 0.37 |
| Cs3d5 A | 724.77 | 1.52 | 2195.67 | 0.18 |
| B1s A | 189.89 | 1.73 | 46.02 | 0.27 |
| Compound 6 Flood gun off | | | | |
| C1s | 286.48 | 5.04 | 16078.84 | 54.08 |
| O1s | 532.83 | 5.74 | 29497.4 | 35.47 |
| Mn2p | 643.12 | 5.43 | 34440.86 | 9.85 |
| Zn2p3 | 1022.94 | 1.56 | 3184.99 | 0.6 |
| Compound 6 Flood gun on | | | | |
| C1s A | 284.8 | 1.43 | 11531.34 | 37.31 |
| C1s B | 286.46 | 1.44 | 3565.58 | 11.54 |
| C1s C | 287.8 | 1.43 | 1225.19 | 3.97 |

TABLE 2-continued

| Name | Peak BE | FWHM eV | Area (P) CPS · eV | Atomic % |
|---|---|---|---|---|
| C1s D | 288.83 | 1.43 | 523.23 | 1.69 |
| K2p3 A | 293.05 | 1.33 | 802 | 0.84 |
| O1s A | 529.69 | 1.1 | 7794.11 | 9.01 |
| O1s B | 531.05 | 1.79 | 12072.15 | 13.96 |
| O1s C | 532.89 | 1.79 | 9635.42 | 11.15 |
| Mn2p | 641.56 | 2.96 | 35629.45 | 9.8 |
| Zn2p3 A | 1021.96 | 2.14 | 3031.13 | 0.55 |
| Cl2p3 A | 198.39 | 1.68 | 97.24 | 0.18 |
| Compound 7 Flood gun off | | | | |
| C1s | 295.02 | 4.74 | 384197.31 | 63.87 |
| O1s | 540.93 | 5.64 | 462044.19 | 29.16 |
| Mn2p | 651.64 | 5.8 | 449804.85 | 6.97 |
| Compound 7 Flood gun on | | | | |
| C1s A | 284.8 | 1.4 | 20976.41 | 49.62 |
| C1s B | 286.43 | 1.4 | 3209.7 | 7.59 |
| C1s C | 287.8 | 1.4 | 2524.45 | 5.97 |
| C1s D | 289.1 | 1.16 | 328.13 | 0.78 |
| O1s A | 529.77 | 1.21 | 9995.19 | 8.45 |
| O1s B | 531.59 | 1.92 | 16556.57 | 14 |
| O1s C | 532.67 | 1.92 | 7030.85 | 5.95 |
| Mn2p | 641.46 | 3.01 | 37205.61 | 7.48 |
| Cl2p3 A | 199.58 | 2.4 | 118.98 | 0.16 |
| Compound 8 Flood gun off | | | | |
| C1s A | 284.8 | 1.67 | 11087.57 | 25.47 |
| C1s B | 286.16 | 1.67 | 3430.92 | 7.88 |
| C1s C | 287.8 | 1.67 | 1600.47 | 3.68 |
| O1s | 532.14 | 2.11 | 58495.87 | 48.05 |
| Gd3d5 | 1187.82 | 5.23 | 237397.98 | 14.7 |
| Cl2p3 A | 198.94 | 1.45 | 171.04 | 0.22 |
| Compound 9 | | | | |
| C1s A | 284.5 | 1.74 | 8622.75 | 22.9 |
| C1s B | 285.97 | 1.74 | 1822.39 | 4.84 |
| C1s D | 287.5 | 1.74 | 1182.17 | 3.14 |
| O1s | 531.19 | 2.07 | 56095.18 | 53.24 |
| Gd3d5 | 1186.72 | 5.47 | 222330.58 | 15.89 |
| Compound 10 | | | | |
| C1s A | 284.8 | 1.64 | 16342.08 | 38.46 |
| C1s B | 286.37 | 1.64 | 3029.91 | 7.13 |
| C1s C | 287.8 | 1.64 | 1452.46 | 3.42 |
| C1s D | 289.23 | 1.64 | 1195.02 | 2.81 |
| O1s A | 531.59 | 1.83 | 35725.86 | 30.05 |
| O1s B | 533.05 | 1.83 | 6049.78 | 5.09 |
| Ni2p3 | 855.99 | 2.68 | 68658.87 | 12.7 |
| Cl2p3 A | 198.74 | 1.8 | 253.08 | 0.33 |
| Compound 11 | | | | |
| C1s A | 284.5 | 1.07 | 26455.27 | 68.04 |
| C1s B | 285.3 | 1.07 | 3986.92 | 10.25 |
| C1s C | 286.32 | 1.07 | 1513.1 | 3.89 |
| C1s D | 287.5 | 1.07 | 995.45 | 2.56 |
| C1s E | 288.66 | 1.07 | 688.19 | 1.77 |
| O1s A | 531.9 | 1.45 | 8552.42 | 7.86 |
| O1s B | 533.36 | 1.45 | 2191.42 | 2.02 |
| O1s C | 534.98 | 1.45 | 604.8 | 0.56 |
| Si2p B | 104.96 | 1.92 | 39.03 | 0.11 |
| Si2p3 C | 101.76 | 1 | 546.62 | 2.33 |
| B1s A | 190.85 | 2.4 | 45.4 | 0.31 |
| Ni2p3 | 854.88 | 2.01 | 1504.81 | 0.3 |

Preparation of Graphene Inks

Figure 2:
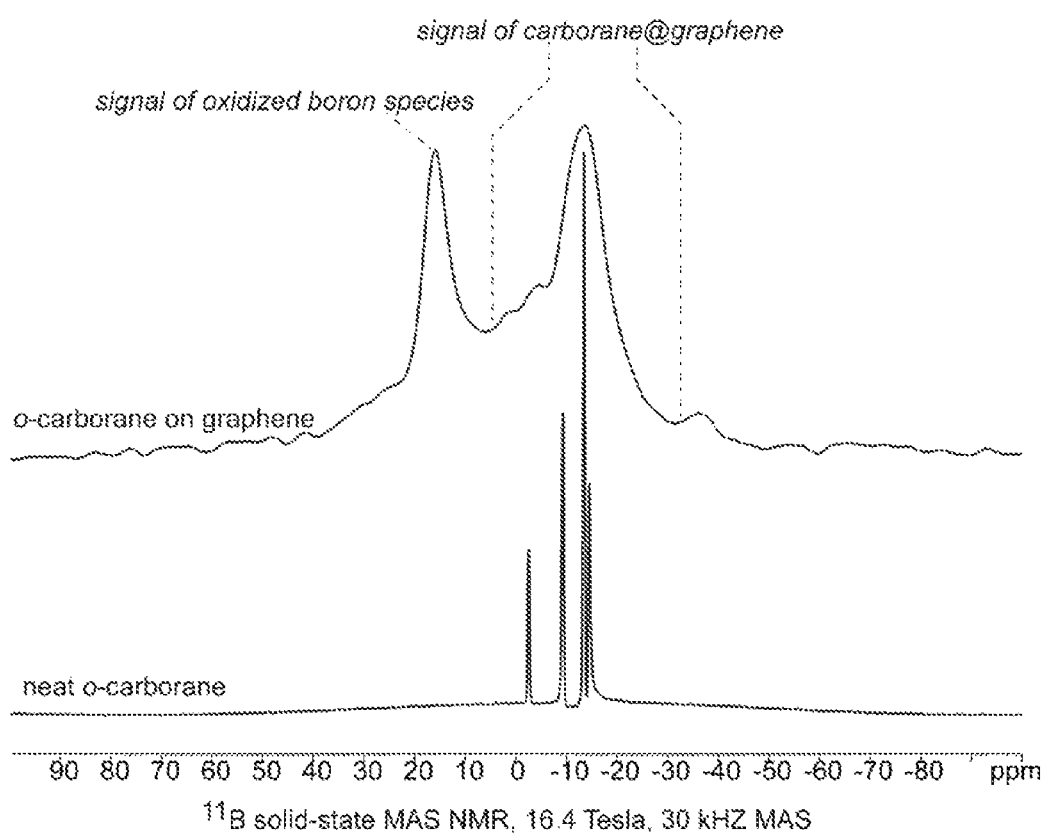
FIG. 2—Characterisation of Compound 1 by nuclear magnetic resonance (NMR) spectroscopy, validating the procedure described in *Chem. Commun.*, 2014, 50, 11332-11334.

A solution of 5 wt. % ethyl cellulose dissolved in 80:20 toluene:ethanol (100 mL) and treated to bath sonication for 1 hour. Graphene (200 mg) is added to the solution and sonicated for 2 hour then undergoes probe sonication for 2 hours. The sonicated mixture is allowed to sediment for 12 hours under gravity, and the supernatant is collected by pipetting. The collected supernatant is mixed with cyrene (20% vol.) and probe sonicated for 1 hour, followed by bath sonication for 10 hours. The material is centrifuged (2 hours, 4200 rpm), and the resulting supernatant is extracted to give the ink (FIG. 2, image a)). This method can also be utilised for systems comprising graphene with a carborane and/or a metallacarborane.

Ink-Jet Printing of Graphene

Figure 3:
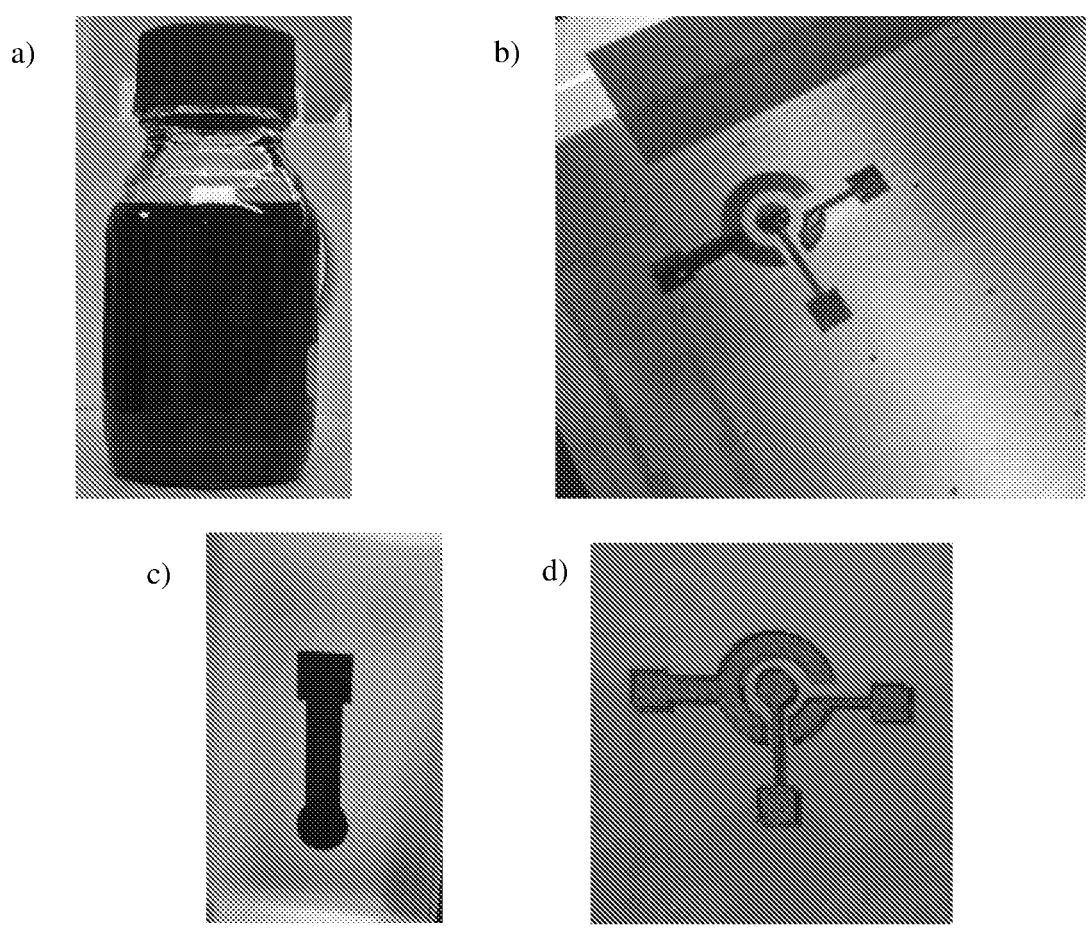
FIG. 3—Image a) graphene ink; image b) inkjet printing of graphene ink for a simple three-electrode pattern on polyimide film; image c) inkjet printing of graphene ink for a simple electrode pattern on polyimide film; and image d) a laser scribed printing treatment of graphene ink using a $CO_2$ laser printer.

Graphene inks were patterned on a polyimide films by drop-on-demand inkjet printing (Fujifilm Dimatix DMP-2850). The ink is loaded into a printer cartridge (Dimatix DMC-11610) having a 21 μm nozzle diameter and 10 μL nominal drop volume. After mounting the cartridge, the meniscus pressure is optimised at 4.0 inches Hg. A polyimide film substrate (125 μm) was secured to the print bed by vacuum, and using plastic tape, onto which a three electrode pattern is inkjet printed with a drop spacing of 20 μm at a resolution of 1270 dpi, utilising three active nozzles and a total of 14 print passes. The ink is heated to 30° C. before jetting and the substrate is maintained at 30° C. during printing. The printed pattern is post-annealed at 250° C. for 30 minutes (FIG. 3, images b) and c)).

Laser-Scribed Printing of Graphene

Ink-jet printed graphene inks were transferred to a laser printer (Full Spectrum LASER H-series) and was treated using a $CO_2$-laser at 17% power, with the purpose of surface activation and physical property (conductivity) improvements (FIG. 3, image d)).

Laser-Scribed Printing of Graphene Oxide

Graphene oxide was dispersed in water (4 mg/mL) and sonicated for 2 hours, then drop casted on various superstrates including aluminium foil, graphite, and polymer films, to produce a homogeneous film coating in the absence of cracking. Laser printing was performed on the coating using a $CO_2$ laser treatment at 16% power and 80% speed, with a fast reduction process to control the device shape (resulting in an interdigitated pattern for electrochemical testing).

Basic Electrochemistry of Graphene-Ink Printed Electrodes

Figure 4:
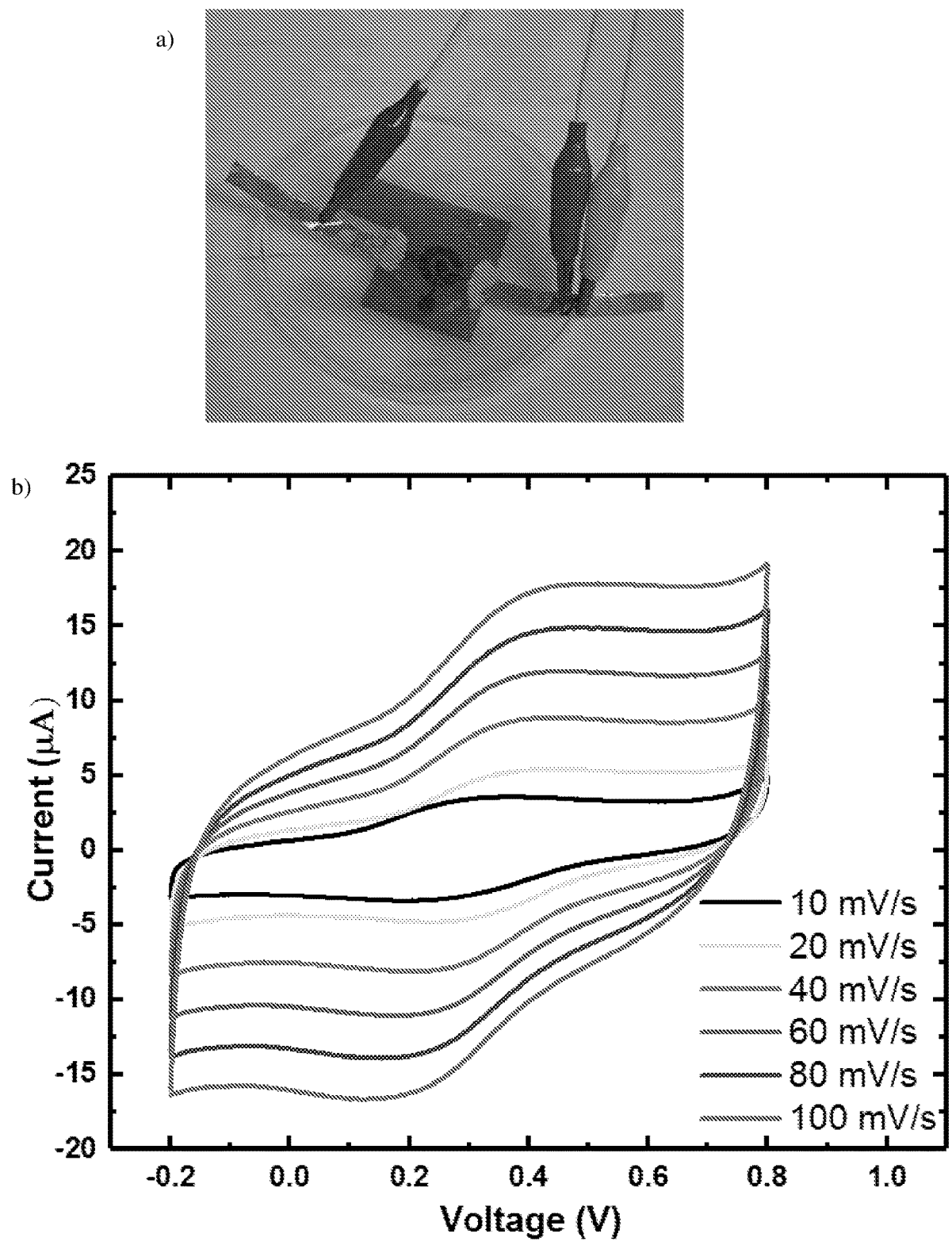
FIG. 4—Image a) simple setup of three-electrode pattern for testing graphene ink printed electrodes; and image b) electrochemical properties (right) in 1M $H_2SO_4$.
Figure 6A:
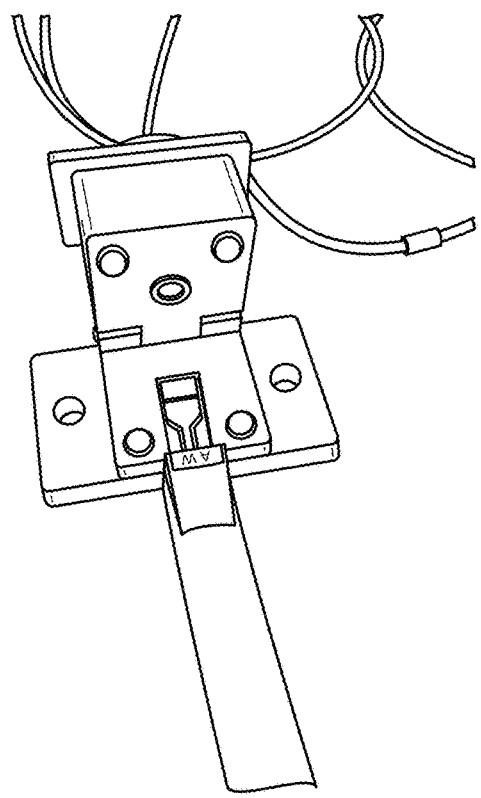
FIG. 6—A biosensing setup with: image a) showing an electrode that contains the graphene for sensing; and image b) showing the connection to an external read out.
Figure 6B:
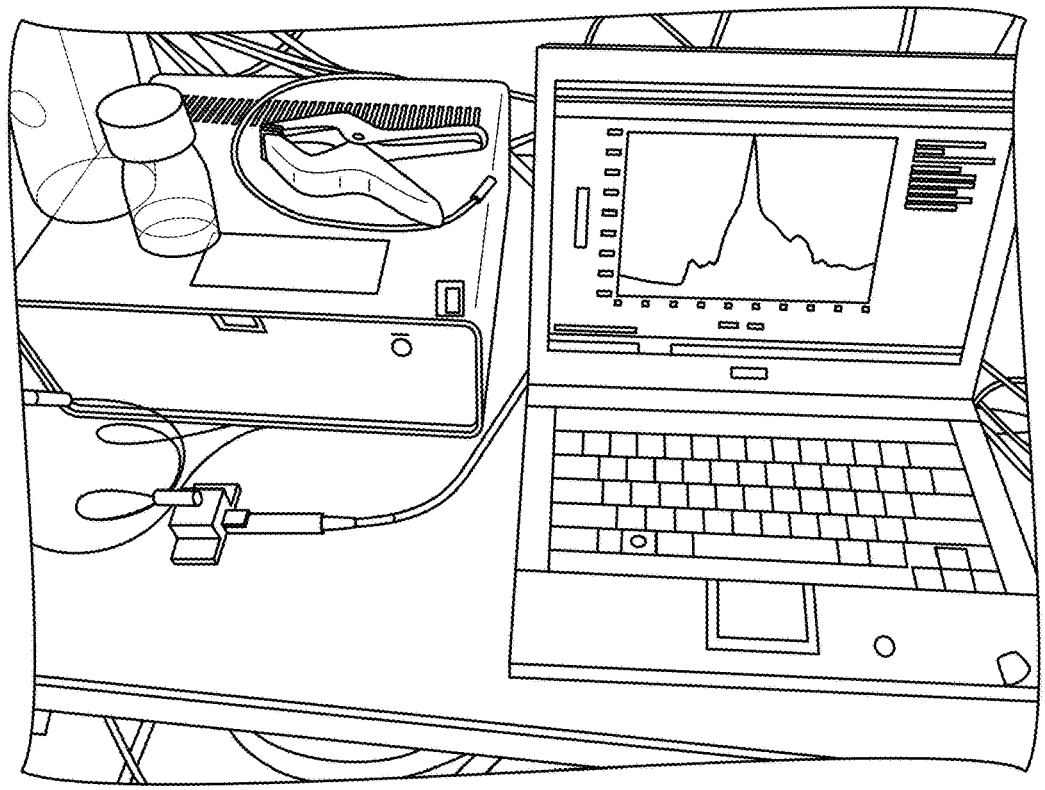
Figure 7:
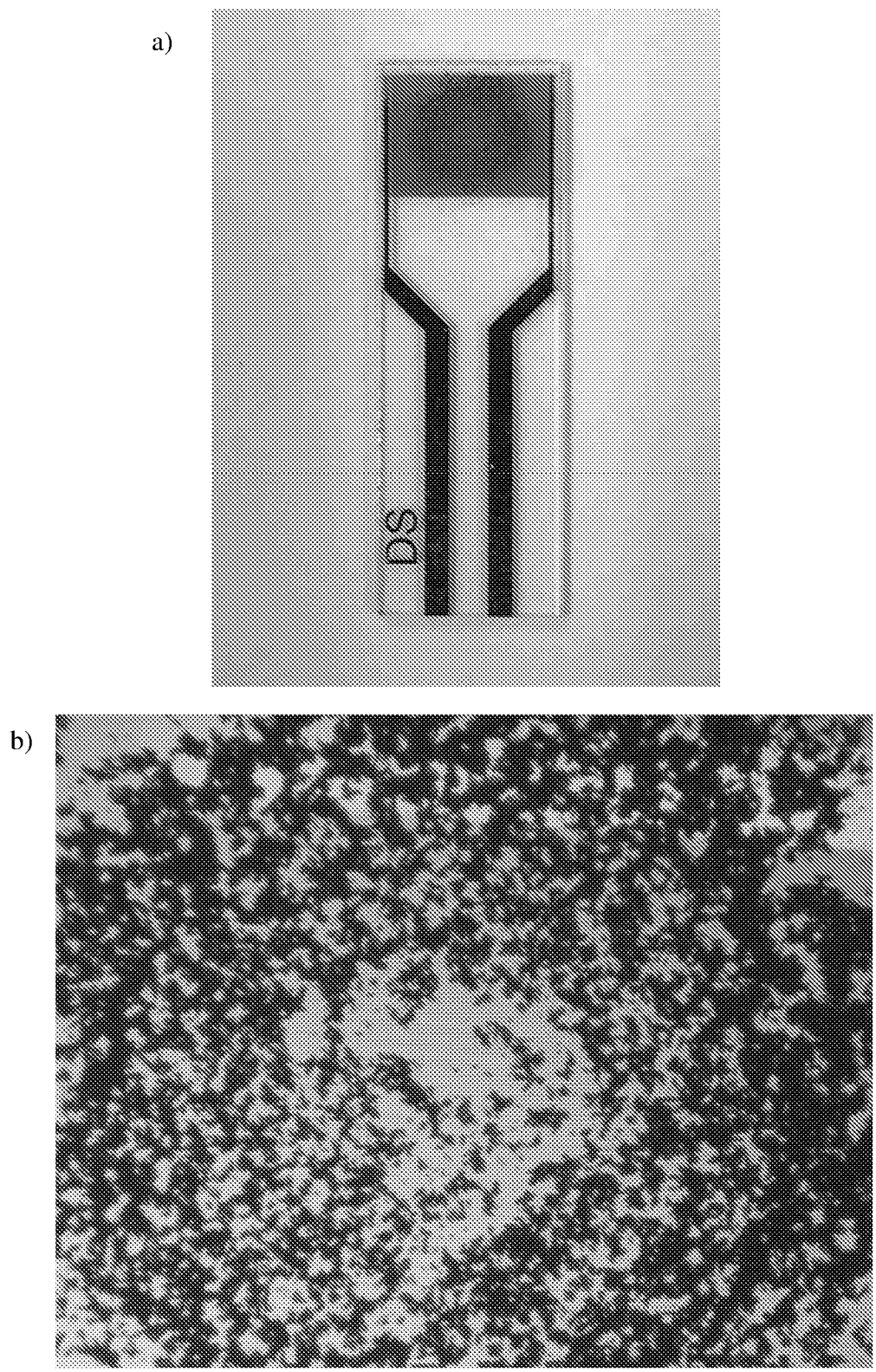
FIG. 7—Image a) shows an interdigitated electrode (IDE) modified with graphene. Image b) is a photo taken of the region containing graphene particles, using a microscope prepared by 1 mg/ml graphene-ethanol mixture ultrasonicated for 1 hour, and then drop-coating on the IDE.
Figure 8:
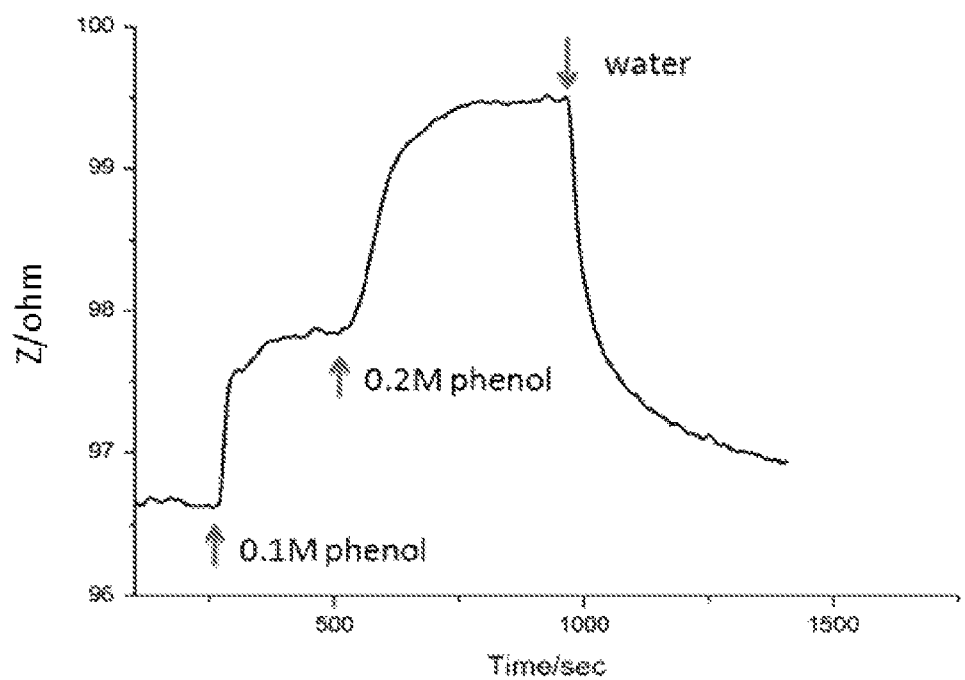
FIG. 8—An impedance-time spectrum. The solution adding sequence is pure water solution to 0.1 M phenol (water solution) to 0.2 M phenol (water solution) to pure water solution.
Figure 9:
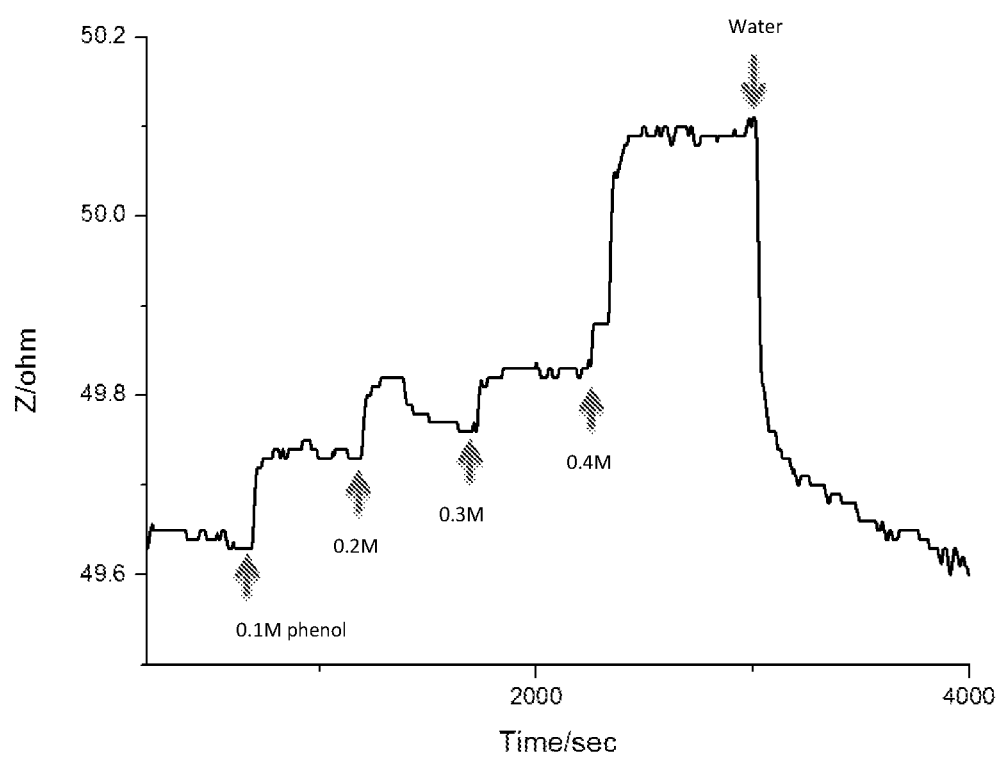
FIG. 9—An impedance-time spectrum with an increase the concentration of phenol form 0.1 M to 0.4 M.
Figure 10:
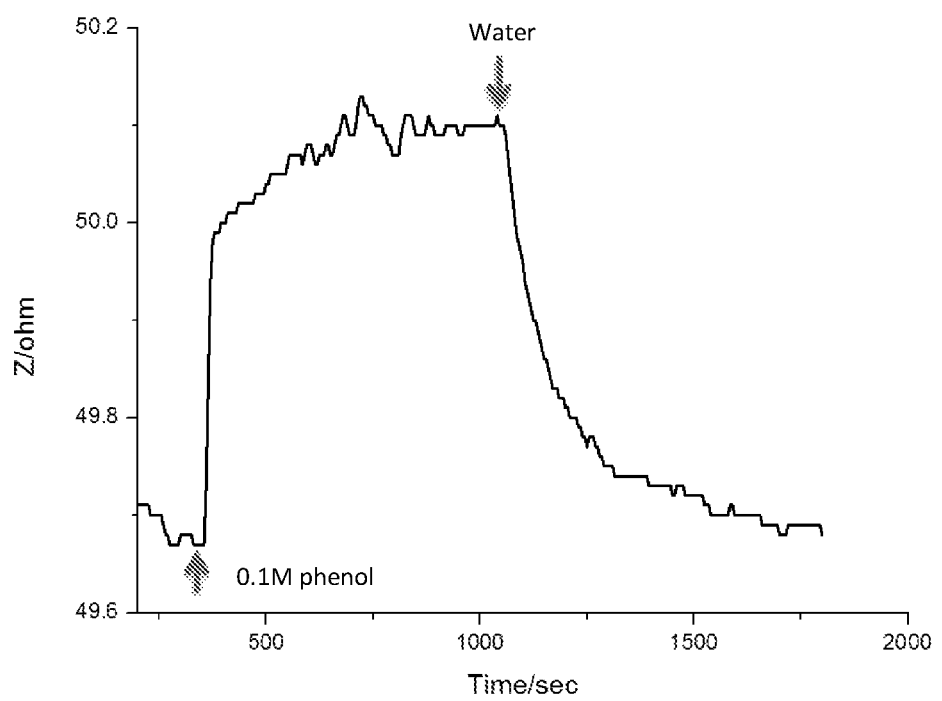
FIG. 10—An impedance-time spectrum where 0.1 M phenol was added to the system.
Figure 11:
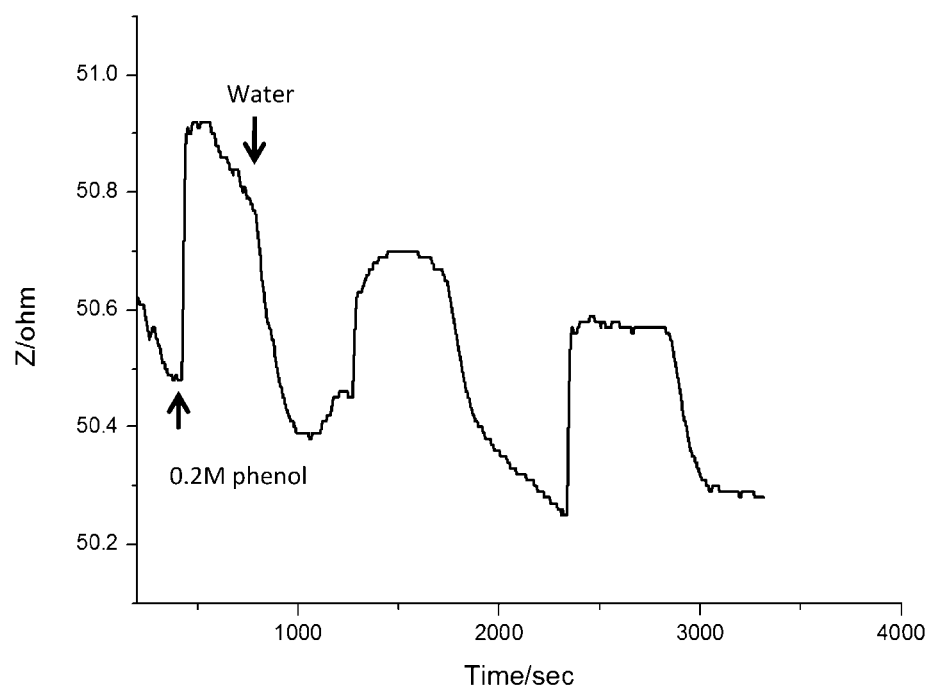
FIG. 11—An impedance-time spectrum, wherein 0.2 M phenol was added to the system and repeated three times.
Figure 12:
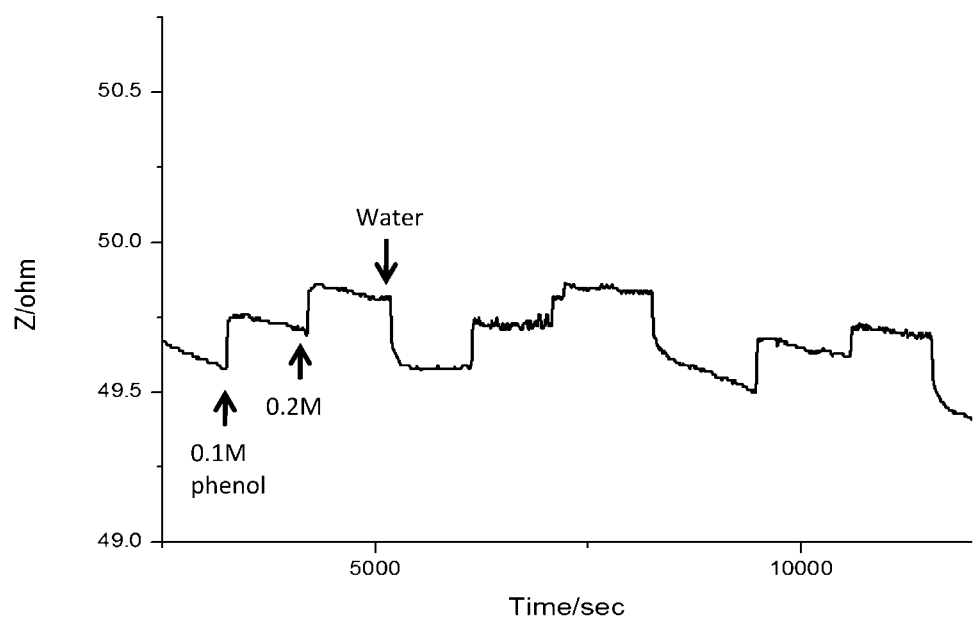
FIG. 12—An impedance-time spectrum where two different concentrations (0.1 M and 0.2 M) of phenol were added to the system and repeated three times.

Electrochemical measurements of the graphene printed electrodes were performed by preparing printed patterns over a surface area of 1 $cm^2$. The patterns were dipped into 1 M $H_2SO_4$ for 12 hours. Copper or gold foil is used to collect current. Cyclic voltammetry (CV) was performed using a two-electrode configuration (CHI 760E Electrochemical Workstation) and are done between 0 and 1 V at different scan rates from 10 to 100 mV $s^{-1}$. All measurements are performed at 25° C. (FIGS. 4, 6 and 7).

Basic Electrochemistry of Graphene Oxide Patterned by Laser-Printer Treatment

Figure 5:
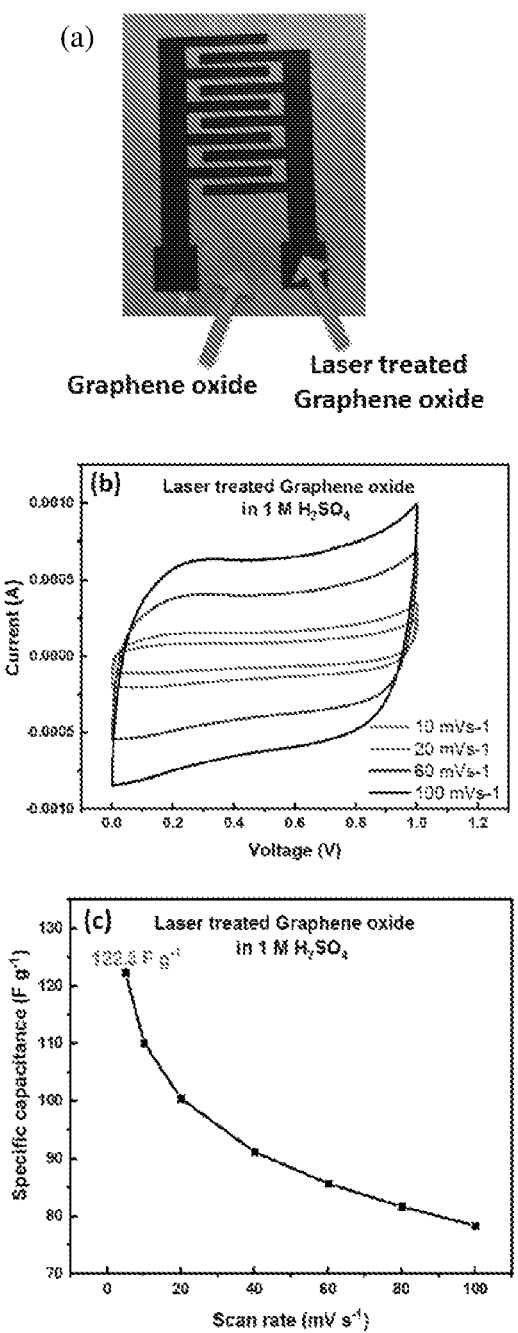
FIG. 5—Image (a) shows an interdigitated pattern prepared by laser treated printing using graphene oxide inks; image (b) shows a cyclic voltammetry curves at different scan rates; and image (c) displays the calculated specific capacity at different scan rates.

The cyclic voltammetry (CHI 760E Electrochemical Workstation) was performed between 0 and 1 V at different scan rates from 5 to 100 mV s−1. All measurements were performed at 25° C. in 1 M $H_2SO_4$ as electrolyte (FIG. 5).

Time Impedance Sensor Response of the Synthesised Graphene

The electrochemical impedance was performed using an electrochemical station (CHI 800). The impedance signal is continuously monitored after establishing a base line in pure water (with 0.05 KCl) followed by the addition different concentrations of phenol (0.1 M to 0.15 M) in pure water (FIGS. 8 to 12).

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

Throughout this specification and the claims which follow, unless the context requires otherwise, the word "comprise", and variations such as "comprises" or "comprising", will be understood to imply the inclusion of a stated integer or step or group of integers or steps but not the exclusion of any other integer or step or group of integers or steps.

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

The invention claimed is:

1. A complex comprising $[C_2B_9H_{11}]$-graphene or $[C_2B_9H_{10}]$-graphene complexed to a metal selected from the group consisting of zinc (Zn), manganese (Mn), gadolinium (Gd), nickel (Ni), and iron (Fe).

2. The complex according to claim 1, wherein the metal is selected from the group consisting of nickel, zinc, manganese and iron.

3. The complex according to claim 1, wherein the metal is gadolinium.

4. The complex according to claim 1, wherein the $[C_2B_9H_{11}]$-graphene or $[C_2B_9H_{10}]$-graphene is a closo- or nido-graphene.

5. The complex according to claim 1, wherein the $[C_2B_9H_{11}]$-graphene or $[C_2B_9H_{10}]$-graphene is bound to graphene by one boron-carbon single bond.

6. The complex according to claim 1, wherein the $[C_2B_9H_{11}]$-graphene or $[C_2B_9H_{10}]$-graphene is bound to graphene by two boron-carbon single bonds.

7. The complex according to claim 1, wherein the graphene is pristine graphene, oxygenated graphene, structurally modified oxygenated graphene or structurally modified graphene in air.

8. The complex according to claim 4, wherein the $[C_2B_9H_{11}]$-graphene or $[C_2B_9H_{10}]$-graphene is a 1,2-closo-$[C_2B_9H_{11}]$- or a 1,2-closo-$[C_2B_9H_{10}]$-graphene.

9. The complex according to claim 1, wherein the $[C_2B_9H_{11}]$-graphene or $[C_2B_9H_{10}]$-graphene is covalently bound to a graphene.

10. A composition comprising the complex of claim 1 and one or more additives.

11. The composition according to claim 10, wherein the composition is an ink.

12. A device comprising a surface comprising a layer of the complex of claim 1.

13. The device according to claim 12, wherein the device is electronic.

14. A device comprising a surface comprising a layer of the composition according to claim 10.

15. The complex according to claim 1, wherein the metal is Zn.

16. The complex according to claim 1, wherein the metal is Mn.

17. The complex according to claim 1, wherein the metal is Ni.

18. The complex according to claim 1, wherein the metal is Fe.

* * * * *